United States Patent [19]

Kobayashi et al.

[11] Patent Number: 5,004,720
[45] Date of Patent: Apr. 2, 1991

[54] PROCESS FOR PRODUCING A SUPERCONDUCTOR OF AN OXIDE SYSTEM FROM ACETYLACETONATES

[75] Inventors: Toshio Kobayashi; Fusaoki Uchikawa; Kenji Nomura; Masao Morita; Shouichi Yokoyama, all of Amagasaki, Japan

[73] Assignee: Mitsubishi Denki Kabushiki Kaisha, Tokyo, Japan

[21] Appl. No.: 235,542

[22] Filed: Aug. 24, 1988

[30] Foreign Application Priority Data

| Aug. 24, 1987 | [JP] | Japan | 62-210923 |
| Aug. 24, 1987 | [JP] | Japan | 62-210932 |
| Aug. 24, 1987 | [JP] | Japan | 62-210935 |
| Aug. 24, 1987 | [JP] | Japan | 62-210936 |
| Aug. 24, 1987 | [JP] | Japan | 62-210949 |
| Mar. 31, 1988 | [JP] | Japan | 63-81715 |
| Apr. 18, 1988 | [JP] | Japan | 63-96277 |

[51] Int. Cl.$^5$ .................. C04B 35/00; H01B 12/00; H01B 13/00; H01L 39/12
[52] U.S. Cl. ................................. 505/1; 423/593; 505/734; 505/735
[58] Field of Search .............. 423/593; 505/1, 734, 505/735

[56] References Cited

U.S. PATENT DOCUMENTS 4,719,127 1/1988 Greenberg .......................... 427/226

OTHER PUBLICATIONS

Accibal et al., "Comparison of several Cu(I) and Cu(II) precursois . . ."Better Ceramics Through Chem. III Inspec 89:3363387 Mater. Res. Soc. 1988, pp. 401–406, Conference 5–8, Apr. 1988.

*Primary Examiner*—Theodore Morris
*Assistant Examiner*—David Schumaker
*Attorney, Agent, or Firm*—Oblon, Spivak, McClelland, Maier & Neustadt

[57] ABSTRACT

A process for producing a superconductor of an oxide system, which comprises uniformly mixing metal elements for constituting the oxide system at least partly in the form of acetylacetonates in a solvent with the rest, if any, being in the form of alkoxides, carboxylates and/or inorganic salts, hydroxides and/or oxides to obtain a homogeneous mixture, and sintering the mixture.

9 Claims, 10 Drawing Sheets

PROCESS FOR PRODUCING A SUPERCONDUCTOR OF AN OXIDE SYSTEM FROM ACETYLACETONATES

BACKGROUND OF THE INVENTION

1. Field of the Invention

The present invention relates to a process for producing a superconductor of an oxide system.

2. Discussion of Background

Conventional superconductors are most commonly of a metallic type. Among them, $Nb_3Ge$ had the highest transition temperature (critical temperature) for superconductivity at a level of 23.2 K.

On the other hand, with superconductors of a metal oxide system, the critical temperature was usually lower than the superconductor of a metallic system and was at a level of 13 K even with $BaPb_{1-x}Bi_xO_3$ which had the highest critical temperature.

Recently, however, as a superconductor of an oxide system having a high critical temperature, a material of a La-Sr-Cu-O system (critical temperature: about 40 K) and a material of a Y-Ba-Cu-O system (critical temperature: about 90 K) have been discovered and have created a boom for the development of materials having high temperature superconductivity.

For the preparation of these superconductors of an oxide system, a so-called dry (powder) method and a coprecipitation method have been commonly and widely used as disclosed in Zeitschrift for Physik B-Condensed Matter, Vol. 64, p. 189 (1986) and Japanese Journal of Applied Physics, Vol. 26, No. 3, PL 196 (1987) and ditto, Vol. 26, No. 4, PL 314 (1987).

The dry method is a method wherein powder materials of oxides or carbonates of e.g. La, Y, Ba, Sr and Cu are mechanically mixed by means of a mortar or a mill, followed by sintering to obtain a sintered product of oxides.

The coprecipitation method is a method wherein nitrates of the above-mentioned metals were uniformly mixed and dissolved in an aqueous medium, and then oxalic acid or ammonia is added to simultaneously form the respective precipitates in the form of a mixture The conventional dry method as mentioned above has drawbacks such that even when guaranteed reagents are used as the respective powders, their purity is not so high at a level of from 98 to 99.9% by weight, and impurities are included in the superconductor after sintering. There is a limitation in the uniformity of the mixed state attainable by mechanical mixing of the respective characteristics such that the critical temperature is low, the transition temperature range is wide, and the critical current density is small. Further, the sintering temperature is required to be high, and it takes a long time for the sintering.

In the coprecipitation method, since alkaline earth metal ions hardly precipitate unless the aqueous solution of the mixture is made alkaline, ammonia or the like is added to facilitate the precipitation of alkaline earth metal ions. However, it has a drawback that if ammonia or the like is added, copper forms complex ions, which can hardly be precipitated. Therefore, it has been pointed out that the coprecipitation method is not suitable to obtain a superconductor of an oxide system having a specific desired composition (Applied Physics, Vol. 56, No. 5, p. 606 (1987)). Thus, the coprecipitation method also has a problem in obtaining a sintered product having good superconducting characteristics.

Recently, a new high temperature oxide superconductor (constituting elements: Bi-Sr-Ca-Cu-0) containing no rare earth elements has been reported at a press conference on January 21, 1988 and published on January 22, 1988 by Kinzoku Zairyo Gijutsu Kenkyusho, and has created a further drive for the research of new superconducting superconductor of a Y-Ba-Cu-0 system discovered by professor Chu of Houston University and contains no rare earth elements, and it shows superconducting characteristics even when dipped in water and is stable and readily reproducible. Further, it does not contain Ba as opposed to the oxide superconductor of a YBCO system and is free from the possibility that Ba turns into $BaCO_3$ during the sintering It is therefore possible to set the sintering temperature at a low level. Thus, it is considered to be a practical superconductor. However, this superconductor of a Bi-Sr-Ca-Cu-0 system is also produced by a dry system having the above-mentioned problem.

Further, a new superconductor of an oxide system containing thallium has been discovered by professor Haman of Arkansas University in the United States, which has further promoted the research for new superconducting materials. This superconductor of a Tl-Ca-Ba-Cu-O system has a critical temperature higher than the superconductor of a Y-Ba-Cu-O system and can be regarded as a more practical superconducting material.

However, this superconductor was also prepared by a dry method wherein powder materials of oxides or carbonates of thallium, calcium, barium and copper were mixed by means of a mortar or a mill, followed by sintering to obtain a sintered product of oxides.

SUMMARY OF THE INVENTION

The present invention has been made to overcome the above-mentioned problems.

More specifically, it is an object of the present invention to provide a process for producing a superconductor of an oxide system having excellent superconducting characteristics such that as compared with the conventional methods, the transition temperature (critical temperature) for superconductivity is high, the transition temperature range is narrow and the critical current density (current density at the critical temperature or below) can be made high.

It is another object of the present invention to provide a process for producing an oxide superconductor of a Bi-Sr-Ca-Cu-O system having excellent superconducting characteristics, whereby the metal elements are homogeneously mixed as compared with the conventional method for the production of such a superconductor.

A further object of the present invention is to provide a process for producing a superconductor of a Tl-Ca-Ba-Cu-O system having excellent superconducting characteristics by a low temperature sintering.

The present invention provides a process for producing a superconductor of an oxide system, which comprises uniformly mixing metal elements for constituting the oxide system at least partly in the form of acetylacetonates in a solvent with the rest, if any, being in the form of alkoxides, carboxylates and/or inorganic salts, hydroxides and/or oxides to obtain a homogeneous mixture, and sintering the mixture.

DETAILED DESCRIPTION OF THE PREFERRED EMBODIMENTS

Figure 1:
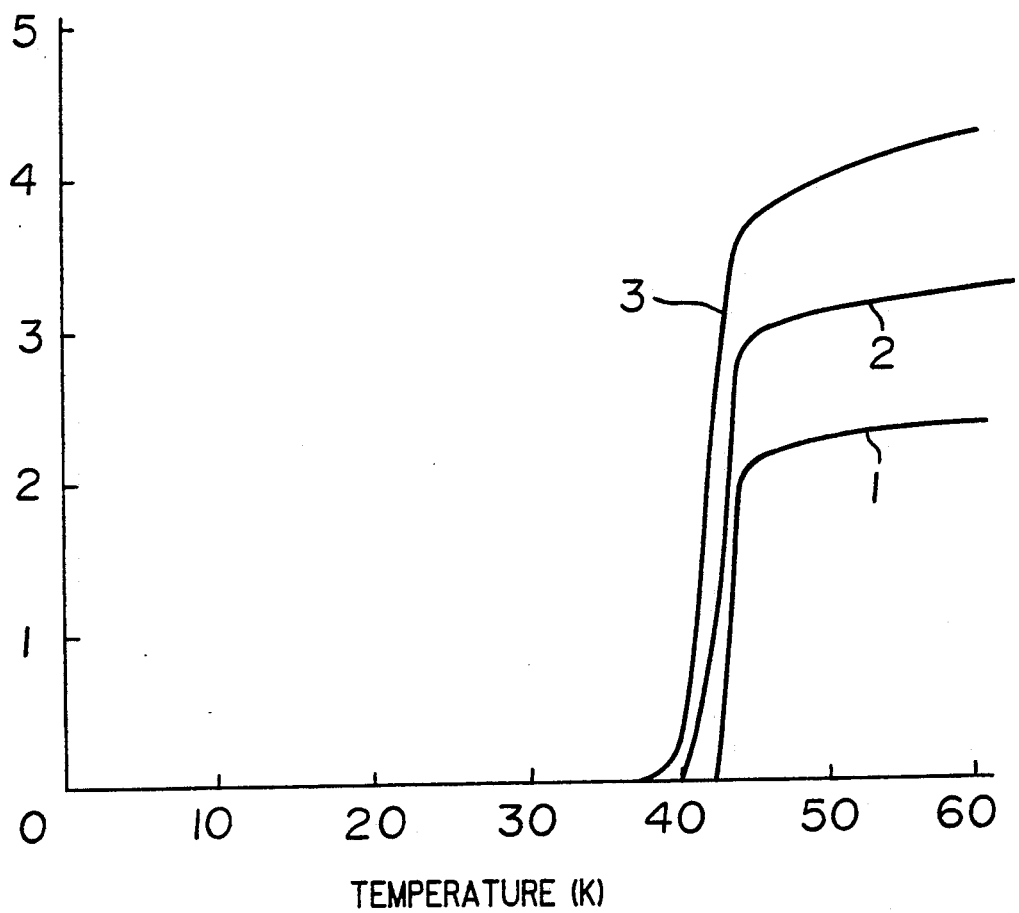
FIG. 1 is a graph showing the relation between the resistivity and the temperature of superconductors of an oxide system obtained in Example 1 (curve 1) and Comparative Examples 1 and 2 (curves 2 and 3).

In a first embodiment of the present invention, the metal elements for constituting the oxide system are at least one element selected from the group consisting of Mg, Ca, Sr and Ba of Group IIa of the Periodic Table, at least one element selected from the group consisting of Sc, Y and lanthanoides of Group IIIa of the Periodic Table, and Cu, and such metal elements are mixed wholly in the form of acetylacetonates. The homogeneous mixture of the acetylacetonates is then hydrolyzed with an alkali, and the hydrolyzed mixture is washed, followed by sintering to obtain the desired superconductor.

In the present invention, metal acetylacetonates which can readily be uniformly dissolved, dispersed or suspended in a solvent, are employed, whereby a homogeneous mixture can readily be obtained. The metal acetylacetonates are hydrolyzed by an addition of an alkali to the homogeneous mixture, whereby the hydrolyzing speed is very high, and the hydrolysis can readily and completely be conducted. The product thereby obtained is usually gel-form metal hydrates (hydroxides) or oxides, which are hardly soluble, whereby a homogeneous gel mixture is obtained. Further, the hydrolyzed mixture is washed, whereby adverse effects of alkali metal ions to the superconductivity will be eliminated. (If the hydrolyzed mixture is not washed, the transition temperature will be lower by from 1 to 5 K, the transition temperature range will be wider by from 3 to 16 K, and the critical current density will be lower by from 2 to 20 A/cm$^2$.)

The metal acetylacetonates can be prepared in a high purity usually at a level of from 99.999 to 99.99999%. By using such pure materials and highly pure water (such as deionized water or distilled water), it is possible to obtain metal hydrates (hydroxides) or oxide particles (powder) with a purity substantially higher than the case where inorganic reagents such as metal oxides or carbonates are employed (a dry method, or a coprecipitation method).

The present inventors have confirmed by experiments that high performance superconductors of an oxide system can be obtained by the process of the present invention wherein acetylacetonates of at least one element selected from the group consisting of Mg, Ca, Sr and Ba of Group IIa of the Periodic Table, at least one element selected from the group consisting of Sc, Y and lanthanoides as the starting materials. The hydrolyzates obtained by this analyzed by the X-ray analysis. It has been confirmed by experiments that such metal hydrates can be all converted to metal oxides by sintering.

In this embodiment, an acetylacetonate of at least one element selected from the group consisting of Mg, Ca, Sr and Ba (hereinafter referred to as a Group IIa acetylacetonate), an acetylacetonate of at least one element selected from the group consisting of Sc, Y and lanthanoides (hereinafter referred to as a Group IIIa acetylacetonate) and Cu acetylacetonate are employed.

A typical Group IIa acetylacetonate may be represented by the formula $(CH_3COCHCOCH_3)_2M^1$ wherein $M^1$ is Mg, Ca, Sr or Ba. A typical Group IIIa acetylacetonate may be represented by the formula $(CH_3COCHCOCH_3)_3M^2$ wherein $M^2$ is Sc, Y or a lanthanoid. A typical Cu acetylacetonate may be represented by $(CH_3COCHCOCH_3)_2Cu$. However, the acetylacetonates are not limited to such specific examples, and may be any acetylacetonates so long as at least one acetylacetonate group is attached to the above-mentioned respective metal elements.

There is no particular restriction as to the ratio of the Group IIa acetylacetonate, the Group IIIa acetylacetonate and the Cu acetylacetonate. They may be mixed in any ratio so long as the desired superconductor of an oxide system can be obtained. However, when Y is used as the Group IIIa element, it is preferred to mix them in a ratio of the Group IIa acetylacetonate/Y acetylacetonate/Cu acetylacetonate =2-10/1/3-10 (atomic ratio of metals). When La is used as the Group IIIa element, it is preferred to mix them in a ratio of (the Group IIa acetylacetonate+La acetylacetonate)/Cu acetylacetonate=2/1 (atomic ratio of metals). There is no particular restriction as to the atomic ratio of metals as between the Group IIa acetylacetonate and the La acetylacetonate.

The above-mentioned metal acetylacetonates are uniformly dissolved, dispersed or suspended in a solvent such as methanol, ethanol, isopropanol, benzene, toluene, xylene, tetrahydrofuran, diethyl ether, diphenyl ether or dioxane and then hydrolyzed by an addition of an alkali such as KOH, NaOH or LiOH, if necessary, together with water.

In this specification, the term "uniformly mixed" is a concept which covers not only the uniformity like a solution but also a substantially uniformly mixed state of an emulsion or a dispersion.

There is no particular restriction as to the conditions for the hydrolysis such as the concentration of the metal acetylacetonates, the amount of the alkali and the amount of water. However, the amount of the alkali for the hydrolysis is preferably from 0.1 to 5 mol% relative to the total molar amount of the metal acetylacetonates used, whereby the alkali can be removed substantially completely in the subsequent washing step, and a mixture of high purity can readily be obtained. The amount of water may be at any level in excess of the stoichiometric amount for the hydrolysis of the metal acetylacetonates and is preferably in large excess. The temperature is preferably at least 60° C.

The hydrolyzed mixture thus prepared, is washed with distilled water or deionized water, or a water-containing solvent wherein an organic solvent well missible with water, such as methanol, ethanol, propanol or acetone is added.

When the hydrolyzed mixture (metal oxides or hydrates) is in a liquid form, it is cleaned, for example, by filtration and drying followed by washing with water, by evaporating the solvent, followed by washing, or by repeating the operation of centrifugal separation and addition of a solvent. When the hydrolyzed mixture is in a gel form, the alkali metal ions may be removed, for example, by washing it as it is, or in some cases, washing it after evaporating the solvent or after filtration and drying.

The hydrolyzed homogeneous mixture thus washed, is sintered to obtain a superconductor of an oxide system.

The hydrolyzates may be metal oxides depending upon the elements. However, hydrolyzates are usually amorphous hydrates (inclusive of hydroxides) in many cases, and such amorphous hydrates can readily be converted to metal oxides at a relatively low temperature (200–500° C.) by sintering.

The organic components are thermally decomposed by sintering. However, the atomic ratio of the metal components in the sintered product are substantially the same as the atomic ratio of metals in the metal acetylacetonates used as the starting materials.

There is no particular restriction as to the sintering conditions (such as the temperature, the number of times and the atmosphere). The sintering is conducted usually at a temperature of from 800 to 1,000° C., preferably from 900° to 950° C. for at least 2 hours, preferably at least 4 hours. At the time of sintering, the hydrolyzed mixture may be presintered at a temperature of from 800 to 1,000° C., preferably from 900° to 950° C., for at least 2 hours, preferably at least 4 hours, then pulverized and molded and finally sintered at a temperature of from 850° to 1000° C., preferably from 900° to 950° C. for at least 2 hours, preferably at least 4 hours.

There is no particular restriction as to the pressure for molding. However, the pressure is preferably high and is usually preferably at least 0.5 kg/cm$^2$G. The atmosphere for sintering may be an oxygen atmosphere or air. However, in order to obtain a product having good superconductivity, it is preferred to employ an atmosphere rich in oxygen.

There is no particular restriction as to the cooling conditions after the sintering. The sintered products may be naturally cooled in air unless cracking occurs, or may be cooled in an oxygen stream over a period of about 8 hours.

In a second embodiment of the present invention, the same metal elements as in the first embodiment are uniformly mixed in a solvent in the form of the respective alkoxides or acetylacetonates, followed by hydrolysis to obtain a mixture of oxides or hydrages (hydroxides) of such metal elements, and the mixture is then sintered to obtain a superconductor of an oxide system.

The alkoxides or acetylacetonates of the metal elements used in this embodiment are uniformly dissolved, dispersed or suspended in a solvent and then hydrolyzed by an addition of water, whereby they usually undergo a change from a sol to a gel and finally form the metal hydrates (hydroxides) or oxide particles. This method is a so-called alkoxide process and has such features that it is thereby possible to obtain super fine particles of metal hydrates (hydroxides) or oxides and that it is possible to obtain a homogeneous mixture of two or more different kinds of metal hydrates (hydroxides) or oxides.

The conditions for the hydrolysis and the speed of hydrolysis are usually substantially different as between the metal alkoxides and the metal acetylacetonates. In order to obtain a uniform mixture of plurality of oxides, it is advisable to use one of the two types.

The metal alkoxides or acetylacetonates to be used in this embodiment are alkoxides or acetylacetonates of Mg, Ca, Sr, Ba, Sc, Y, lanthanoides and/or Cu. They may be of any structures or forms. Namely, the alkoxy group for the metal alkoxides may have any number of carbon atoms and may be an alkoxy group from a polyhydric alcohol. Preferred examples of such an alkoxy group include, for example, a methoxy group, an ethoxy group, a propoxy group, an isopropoxy group, a butoxy group, a tertiary butoxy group or a secondary butoxy group. However, the alkoxy group is not limited to such specific examples. There is no particular restriction to the number of alkoxy groups or acetyl groups bonded to a metal element. At least one such a group may be bonded to a metal element.

There is no particular restriction as to the ratio in mixing an alkoxide or acetylacetonate of at least one element selected from the group consisting of Mg, Ca, Sr and Ba (hereinafter referred to as a Group IIa compound), an alkoxide or acetylacetonate of at least one element selected from the group consisting of Sc, Y and lanthanoids (hereinafter referred to as a Group IIIa compound and an alkoxide or acetylacetonate of Cu (hereinafter referred to as a Cu compound). They may be mixed in any ratio so long as a desired superconductor of an oxide system can be obtained. However, when Y is used as the Group IIIa element, it is preferred to mix them in a ratio of the Group IIa compound/the Y-containing compound/the Cu compound=2-10/1/3-10 (atomic ratio of metals). When La is used as the Group IIIa element, it is preferred to mix them in a ratio of (the Group IIa compound+the La-containing compound)/the Cu compound=2/1 (atomic ratio of metals). There is no particular restriction as to the ratio between the Group IIa compound and the La-containing compound.

The above-mentioned metal alkoxides or metal acetylacetonates are uniformly dissolved, dispersed or suspended in a solvent such as methyl alcohol, ethyl alcohol, isopropyl alcohol, benzene, toluene, xylene, tetrahydrofuran, diethyl ether, diphenyl ether, anisole or ethyl acetate and then hydrolyzed. The hydrolyzates may be metal oxides depending upon the elements. However, the hydrolyzates are usually amorphous hydrates (inclusive of hydroxides) in many cases. Such hydrates can in most cases be converted to metal oxides at a relatively low temperature (200–500° C.) by sintering.

There is no particular restriction as to the conditions for the hydrolysis. The hydrolysis may be conducted under the conditions as described with respect to the first embodiment.

The hydrolyzed mixture is treated and sintered in the same manner as described above with respect to the first embodiment.

There is no particular restriction as to the cooling conditions after the sintering. The sintered products may be naturally cooled in air unless cracking occurs, or may be cooled in an oxygen stream over a period of about 5 hours.

In a third embodiment of the present invention, a part of the metal elements which are the same as in the first and second embodiments, are dissolved, dispersed or suspended in a solvent in the form of acetylacetonates. Then, the metal acetylacetonates are hydrolyzed by an addition of an alkali to obtain a hydrolyzate. The rest of the metal elements are mixed with the hydrolyzate in the form of carboxylates to obtain a homogeneous mixture, which is then sintered to obtain a desired superconductor of an oxide system.

In this embodiment, the hydrolyzate of the metal acetylacetonates is mixed with the metal carboxylates, whereby the respective components can be uniformly mixed in the atomic or molecular order. Accordingly, the sintered product obtainable from such a mixture will be homogeneous, and a superconductor of an oxide system having excellent superconductivity will be obtained.

There is no particular restriction as to the metal acetylacetonates to be used. The metal acetylacetonates may be the same as described above with respect to the first embodiment.

Likewise, there is no particular restriction as to the metal carboxylates to be used in this embodiment. They may have any structures or forms so long as they have at least one carboxyl group bonded to a metal. Namely, the carboxylic acids to form the above-mentioned metal carboxylates may have any number of carbon atoms, may be polybasic carboxylic acids, or may contain other groups like an amino acid or oxy acid.

In the case where the metal is Cu, specific examples for such metal carboxylates include, for example, dicarboxyates of the formula $(R^1COO)Cu$ wherein $R^1$ is a hydrogen atom or a substituted or unsubstituted hydrocarbon group having from 1 to 50 carbon atoms, preferably the propionates, acetates, butyrates, oxalates, naphthenates, stearates and citrates. When the metal is Mg, Ca, Sr or Ba, the carboxylates include, for example, dicarboxylates of the formula $(R^2COO)_2M$ wherein M is Mg, Ca, Sr or Ba, and $R^2$ is a hydrogen atom or a substituted or unsubstituted hydrocarbon group having from 1 to 50 carbon atoms, preferably the respective acetates, butanoates, naphthenates, benzoates, stearates, citrates and pentanoates. Likewise, when the metal is Sc, Y or a lanthanoid, the carboxylates include, for example, tricarboxylates of the formula $(R^3COO)_3M'$ wherein M' is Sc, Y or a lanthanoid, and $R^3$ is a hydrogen atom and a substituted or unsubstituted hydrocarbon group having from 1 to 50 carbon atoms, preferably the cyclohexane carboxylates, acetates, butanoates, naphthenates, benzoates, citrates, stearates and octenoates.

In this embodiment, acetylacetonates of at least one type of metal elements among the three types of metal elements i.e. the Group IIa elements, the Group IIIa elements and Cu, are dissolved, dispersed or suspended in a solvent, and then the metal acetylacetonates are hydrolyzed by an addition of an alkali to obtain a hydrolyzate. Then, carboxylates of metal elements of the type other than the type contained in the above metal acetylacetonate, are added to the hydrolyzate to obtain a homogeneous mixture.

There is no particular restriction as to the method for the preparation of such a homogeneous mixture. For example, the predetermined metal acetylacetonates and metal carboxylates may be dissolved, dispersed or suspended in a solvent, and then an alkali is added, if necessary, together with water, to hydrolyze the metal acetylacetonates, whereby a uniform mixture of the hydrolyzate of the metal acetylacetonates and the metal carboxylates may be prepared.

It is of course possible that the metal acetylacetonates are dissolved, dispersed or suspended in a solvent, then hydrolyzed by an addition of an alkali, if necessary together with water, and then the metal carboxylates are added and stirred, so that the hydrolyzate and the metal carboxylates are thoroughly mixed to obtain a homogeneous mixture.

There is no particular restriction as to which metal elements among the three types should be used in the form of metal acetylacetonates and which should be used in the form of metal carboxylates. However, from the viewpoint of e.g. the stability, it is preferred to use Sc, Y and lanthanoids of Group IIIa in the form of metal acetylacetonates. It is of course unnecessary to use all of a certain metal in the form of a metal acetylacetonate. Namely, a part of a metal may be used in the form of a metal acetylacetonate, and the rest may be formed in the form of a metal carboxylate.

Further, there is no particular restriction as to how much among the total metal atoms should be used in the form of the metal acetylacetonates. An optional ratio may be employed so long as a homogeneous mixture can be prepared. However, the proportion of the metal atoms used in the form of metal acetylacetonates in the total metal atoms is preferably from 30 to 90 atomic %, more preferably from 50 to 80 atomic.%, whereby a homogeneous mixture can readily be prepared.

Further, there is no particular restriction as to the ratio of the three types of the metal elements. The ratio of the three types of the metal elements may be the same as described with respect to the first and second embodiments.

The solvent may be methanol, ethanol, isopropanol, tetrahydrofuran, ethyl ether, benzene or toluene. In the hydrolysis of the metal acetylacetonates, an alkali is added, whereby the metal acetylacetonates can readily be hydrolyzed. The amount of the alkali may be small and is usually at least 0.01 mol%, preferably from 0.1 to 1 mol%, relative to the metal acetylacetonates.

There is no particular restriction as to the alkali. Specific examples include sodium hydroxide, potassium hydroxide, ammonia, an amine, lithium hydroxide, barium hydroxide and magnesium hydroxide.

There is no particular restriction as to the conditions for the hydrolysis, which may be the same as described in the first embodiment.

The hydrolyzate of the metal acetylacetonates used in this embodiment may not necessarily be the one wherein the acetylacetonate groups are completely hydrolyzed, so long as it is capable of forming a uniform mixture with the metal carboxylates. Namely, it may be the one wherein acetylacetonate groups are partially hydrolyzed.

The homogeneous mixture thus prepared may be sintered as it is. However, it is possible to further improve the superconductivity of the resulting product by removing e.g. alkali metal ions which adversely affect the superconductivity, by washing the homogeneous mixture with distilled water or deionized water, or a water-containing solvent wherein an organic solvent well missible with water, such as methanol, ethanol, propanol or acetone, is added, prior to the sintering. It has been confirmed by the present inventor that by such washing prior to the sintering, the critical temperature can be made higher by from 1 to 5 K, the transition temperature range can be made narrower by from 2 to 10 K, and the critical current density can be improved by from 2 to 6 A/cm$^2$.

The treatment of the homogeneous mixture and the subsequent sintering may be conducted in the same manner as described in the foregoing embodiments.

In a fourth embodiment of the present invention, a part of the same metal elements as in the preceeding embodiments are dissolved, dispersed or suspended in the form of acetylacetonates and then hydrolyzed with an alkali to obtain a gelled hydrolyzate, and the rest of the metal elements are added to the hydrolyzate in the form of inorganic salts, hydroxides and/or oxides. The homogeneous mixture thus obtained is dried and sintered to obtain a desired superconductor of an oxide system.

An acetylacetonate of at least a part of at least one metal element used in this embodiment is uniformly dissolved, dispersed or suspended in a solvent and then hydrolyzed in the presence of an alkali to obtain a hydrolyzate wherein particles of the metal hydrate (hydroxide) or oxide are uniformly dispersed. To this hydrolyzate, the rest of the metal elements are dissolved, dispersed or suspended in the form of inorganic salts, hydroxides and/or oxides to obtain a mixture, whereby a homogeneous mixture can be obtained. Accordingly, a sintered product obtained from such a mixture will be homogeneous, and a high performance superconductor of an oxide system can be obtained.

The metal acetylacetonates used in this embodiment may be the same as described above with respect to the preceeding embodiments.

The inorganic salts of metals used in this embodiment are salts comprising an anion of Mg, Ca, Sr, Ba, Sc, Y, a lanthanoid or Cu and an anion such as $NO_3^-$, $CN^-$, $Cl^-$, $SO_4^{2-}$, $CO_3^{2-}$, $Br^-$, $F^-$ or $I^-$. Specifically, they include, for example, $YCl_3$, $Y(NO_3)_3$, $BaCl_2$, $Ba(CN)_2$, $CuSO_4$, $CuCO_3$, $MgF_2$, $Mg(CN)_2$, $CaCO_3$, $CaF_2$, $La_2(CO_3)_3$, $La(NO_3)_3$ and $SrCO_3$.

Preferred specific examples of such inorganic salts include nitrates, carbonates and halides of Cu, Sr, Ca, Ba, La, Y and lanthanoids.

The metal hydroxides used in this embodiment are compounds wherein at least one hydroxyl group is bonded to Mg, Ca, Sr, Ba, Sc, Y, lanthanoids or Cu. Typical hydroxides in the case of Mg, Ca, Sr, Ba and Cu are $Mg(OH)_2$, $Ca(OH)_2$, $Sr(OH)_2$, $Ba(OH)_2$ and $Cu(OH)_2$. Typical hydroxides in the case of Sc, Y and lanthanoids are represented by M'(OH) wherein M' is Sc, Y or a lanthanoid.

The oxides of metals to be used in the present invention include CuO in the case where the metal is Cu, MO wherein M is Mg, Ca, Sr or Ba in the case where the metal is Mg, Ca, Sr or Ba, and $M'_2O_3$ wherein M' is Sc, Y or a lanthanoid in the case where the metal is Sc, Y or a lanthanoid.

In this embodiment, at least one part of at least one type of the above-mentioned metal acetylacetonates is uniformly dissolved, dispersed or suspended in a solvent such as methyl alcohol, ethyl alcohol, isopropyl alcohol, butyl alcohol, hexane, petroleum ether, diethyl ether, benzene, toluene, xylene or tetrahydrofuran and then hydrolyzed in the presence of an alkali. Then, inorganic salts, hydroxides and/or oxides of the rest of the elements are dissolved, dispersed or suspended to the hydrolyzate to obtain a homogeneous mixture.

There is no particular restriction as to the alkali. Any alkali may be used so long as it is capable of facilitating the hydrolysis of the metal acetylacetonates. Specific examples of such an alkali include, for example, sodium hydroxide, potassium hydroxide, ammonia, lithium hydroxide, barium hydroxide, magnesium hydroxide and primary, secondary and tertiary amines. The metal acetylacetonates can readily be hydrolyzed by conducting the hydrolysis in the presence of such an alkali.

The alkali may be used in a small amount at a level of at least 0.1 mol% relative to the metal acetylacetonates.

There is no particular restriction as to which metals among those used in this embodiment should be used in the form of metal acetylacetonates or which should be used in the form of inorganic salts, hydroxides and/or oxides. However, from the viewpoint of the operation efficiency and the uniformity of the resulting mixture, it is preferred that metals which can readily be uniformly dissolved, dispersed or suspended in a solvent as metal acetylacetonates should be used in the form of metal acetylacetonates, and those which can hardly be uniformly dissolved, dispersed or suspended as metal acetylacetonates should be employed in the form of inorganic salts, hydroxides and/or oxides. It is of course unnecessary that all of a certain metal be used in the form of the metal acetylacetonate. Namely, a part of a metal may be used in the form of a metal acetylacetonate, and the rest may be used in the form of an inorganic salt, hydroxide and/or oxide.

The conditions for the hydrolysis and the nature of the hydrolyzate of the metal acetylacetonates are as described above with respect to the preceeding embodiments. The mixture containing the hydrolyzate of the metal acetylacetonates thus prepared usually has a nature of a sol. The above-mentioned inorganic salts, hydroxides and/or oxides are mixed thereto, whereby a homogeneous mixture is obtained.

There is no particular restriction as to the ratio of the metal acetylacetonates and the inorganic salts, hydroxides and/or oxides used. However, the ratio of the metal acetylacetonates/the inorganic salts, hydroxides and/or oxides is preferably from 1/1 to 5/1 by atomic ratio of metals with a view to preparing a homogeneous mixture.

There is no particular restriction as to the method for the addition of the inorganic salts, hydroxides and/or oxides. Any method may be employed so long as a homogeneous mixture is obtainable. For example, they may be mixed in the form of powders, or they may be added in the form of an aqueous solution or an alcohol solution, followed by mixing.

There is no particular restriction as to the ratio for mixing three types of compounds i.e. a compound containing at least one element selected from the group consisting of Mg, Ca, Sr and Ba (a Group IIa compound), a compound containing at least one element selected from the group consisting of Sc, Y and lanthanoids (a Group IIIa compound) and a compound containing Cu. Such a ratio may be the same as described above with respect to the ratio of the three types of metal elements in the preceeding embodiments. The homogeneous mixture thus prepared may be washed prior to the sintering as described in the foregoing.

The mixture thus treated is then sintered to obtain a superconductor of an oxide system. The sintering conditions and the cooling conditions after the sintering may be the same as described above with respect to the preceeding embodiments.

In a fifth embodiment of the present invention, a reaction product obtained by reacting a mixture comprising at least one member selected from the group consisting of alkoxides of Mg, Ca, Sr and Ba, at least one member selected from the group consisting of alkoxides of Sc, Y and lanthanoids and an alkoxide of Cu, with acetone and ethyl acetate or with acetylacetone, is hydrolyzed, and the product thereby obtained is sintered to obtain a superconductor of an oxide type.

In this embodiment, the metal elements in a predetermined combination are uniformly dissolved, dispersed or suspended in a solvent in the form of metal alkoxides, and then the metal alkoxides are reacted with acetone and ethyl acetate or with acetylacetone and thereby converted to the respective metal acetylacetonates, whereby it is possible to obtain a mixture more uniform than the mixture obtained by merely mixing the respective metal acetylacetonates in a predetermined ratio. The metal acetylacetonates thus formed are hydrolyzed to obtain a hydrolyzate. The hydrolyzate is accordingly very homogeneous, and the superconductor of an oxide system obtained by sintering it will have excellent superconductivity.

In this embodiment, a homogeneous solution, dispersion or suspension is prepared which comprises an alkoxide containing at least one metal selected from the group consisting of Mg, Ca, Sr and Ba (hereinafter referred to as a Group IIa alkoxide), an alkoxide containing at least one metal selected from the group consisting of Sc, Y and lanthanoids (hereinafter referred to as a Group IIIa alkoxide) and an alkoxide of Cu.

There is no particular restriction as to the structures or forms of the metal alkoxides. They may be of any structures or forms so long as they can be uniformly dissolved, dispersed or suspended in a solvent used and they are capable of forming metal acetylacetonates when reacted with acetone and ethyl acetate or with acetylacetone. Namely, the alkoxy group to form the metal alkoxide may have any number of carbon atoms and may be an alkoxy group from a polyhydric alcohol. Preferred examples of such an alkoxy group include, for example, a methoxy group, an ethoxy group, a propoxy group, an isopropoxy group, a butoxy group, a tertiary butoxy group and a secondary butoxy group. However, the alkoxy group is not limited to such specific examples. There is no specific restriction to the number of alkoxy groups bonded to a metal element, so long as at least one such group is bonded to a metal element.

There is no particular restriction as to the mixing ratio of the Group IIa alkoxide, the Group IIIa alkoxide and the Cu alkoxide. They may be mixed in any ratio so long as the desired superconductor of an oxide system can be obtained. For example, when Y is used as the Group IIIa element, it is preferred to mix them in a ratio of the Group IIa alkoxide/Y alkoxide/Cu alkoxide = 2-10/1/3-10 (atomic ratio of metals). When La is used as the Group IIIa element, it is preferred to mix them in a ratio of (the Group IIa alkoxide+La alkoxide)/Cu alkoxide = 2/1 (atomic ratio of metals). There is no particular restriction as to the ratio between the Group IIa alkoxide and the La alkoxide.

The metal alkoxides are uniformly dissolved, dispersed or suspended in the predetermined ratio as mentioned above in a solvent such as methyl alcohol, ethyl alcohol, isopropyl alcohol, benzene, toluene, xylene, tetrahydrofuran, diethyl ether, diphenyl ether or benzyl alcohol and then reacted with acetone and ethyl acetate or with acetylacetone to obtain metal acetylacetonates.

The mixture of metal acetylacetonates thus prepared is more homogeneous than the one obtained by mixing the respective metal acetylacetonates prepared separately by reacting the respective alkoxides with acetone and ethyl acetate or with acetylacetone. The superconductor of an oxide system prepared from the hydrolyzate of more homogeneous metal acetylacetonates shows superior superconductivity than the superconductor prepared from a mixture obtained by mixing the respective metal acetylacetonates separately produced.

The reason why the characteristics of the superconductor of an oxide type prepared from the homogeneous mixture of metal acetylacetonates obtained by mixing the respective metal elements in the state of metal alkoxides, are superior to the characteristics of the superconductor of an oxide system prepared from a mixture obtained by mixing separately produced acetylacetonates of the respective metal elements, is not adequately understood. However, it is considered that when the metal acetylacetonates are formed from the metal alkoxides, not only the respective metal acetylacetonates are separately formed, but a part thereof may form a composite containing a linkage represented by the formula:

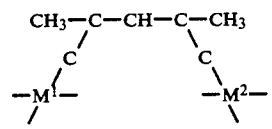

wherein $M^1$ and $M^2$ are different metal atoms, or may form a solvate, thus serving as a link between the different metal acetylacetonates, whereby the entire mixture acts as a unitary substance in the state of a solution, dispersion or suspension, or during the hydrolysis.

There is no particular restriction as to the concentration of the mixture obtained by dissolving, dispersing or suspending the metal alkoxides. The concentration may be at any level so long as the reaction with acetone and ethyl acetate or with acetylacetone can be conducted without trouble. It is usual, however, that a mixture of metal alkoxides is prepared at a concentration of from 5 to 45% by weight, preferably from 10 to 20% by weight, and acetone and ethylacetone, or acetylacetone is added thereto for reaction.

The ratio of acetone to the metal alkoxides when acetone and ethyl acetate are used for the preparation of the metal acetylacetonates, is usually from 0.3 to 2 mols, preferably from 0.8 to 1.2 mols per mol of the alkoxy group of the metal alkoxides. The ratio of ethyl acetate to the metal alkoxides, is usually from 0.5 to 2 mols, preferably from 0.8 to 1.2 mols per mol of the alkoxy group in the metal alkoxides.

The reaction may be conducted in such a manner that for example, acetone is added to the mixture of metal alkoxides, and the mixture is heated at a temperature of from 25° to 70° C. for from 1 to 8 hours. Then, ethyl acetate is added, and the mixture is stirred at a temperature of from 25° to 70° C. for from 30 minutes to 10 hours.

On the other hand, when acetylacetone is used for the preparation of the metal acetylacetonates, the ratio of acetylacetone to the metal alkoxides is usually from 0.5 to 2 mols, preferably from 0.8 to 1.2 mols per mol of the alkoxy group of the metal alkoxides.

The reaction may be conducted, for example, by adding acetylacetone to a mixture of the metal alkoxides, followed by heating at a temperature of from 25° to 75° C. for from 1 to 20 hours.

The metal acetylacetonates thus prepared are hydrolyzed in the same manner as described above with respect to other embodiments. The hydrolyzate is then treated and sintered also in the same manner as described above.

In a sixth embodiment of the present invention, the metal elements for constituting the oxide system are Bi, Sr, Ca and Cu, and they are dissolved, dispersed or suspended in a solvent at least partly in the form of acetylacetonates with the rest, if any, being in the form of alkoxides, followed by removal of the solvent to obtain a homogeneous mixture, which is then sintered to obtain a superconductor of a Bi-Sr-Ca-Cu-O system. The uniformly dissolved, dispersed or suspended mixture may be hydrolyzed prior to the removal of the solvent.

The metal alkoxides and the metal acetylacetonates to be used in this embodiment can be prepared usually in a high purity of from 99.999 to 99.99999%. By using such pure materials and by uniformly mixing them in a solvent, it is possible to obtain a homogeneous superconductor having a high purity.

The alkoxides of Bi, Sr, Ca and Cu to be used in this embodiment may be of any structures or forms. Namely, the alkoxy group for such a metal alkoxide may have any number of carbon atoms and may be an alkoxy group from a polyhydric alcohol. Preferred specific examples of such an alkoxy group includes, for example, a methoxy group, an ethoxy group, a propoxy group, an isopropoxy group, a butoxy group, a t-butoxy group, a sec-butoxy group and ethylene glycol. However, the alkoxy group is not limited to such specific examples. Further, there is no particular restriction to the number of alkoxy groups bonded to a metal element, and at least one alkoxy group may be bonded to a metal element.

The acetylacetonates of Bi, Sr, Ca and Cu to be used in this embodiment are compounds wherein at least one acetylacetonate group is attached to such a metal atom. They may be of any structures or forms. Namely, so long as the basic structure is acetylacetonate, for example, the hydrogen atom may be substituted by a fluorine atom or a hydrocarbon group.

A part or some of Bi, Sr, Ca and Cu may be used in the form of the respective metal alkoxide. Further, one metal may be used in the form of two types of metal compounds as in the case where a Bi alkoxide and a Bi acetylacetonate are used as the Bi component.

There is no particular restriction as to the ratio of Bi, Sr, Ca and Cu. They may be used in any ratio so long as the desired superconductor of an oxide system can be obtained. However, it is preferred to use them in a compositional ratio to form a high Tc phase (Tc=about 120 K (onset)). Usually, a compositional ratio of $Bi_1Sr_{0.5-3}Ca_{0.5-3}Cu_{0.5-3.5}$ is preferred.

In this embodiment, the metal acetylacetonates are uniformly dissolved, dispersed or suspended, optionally together with the above-mentioned metal alkoxides, in a solvent such as methyl alcohol, ethyl alcohol, isopropyl alcohol, butyl alcohol, benzene, toluene, xylene, tetrahydrofuran, diethyl ether, diphenyl ether or DMF. Then, the solvent is removed directly or after the hydrolysis, and the resulting homogeneous mixture is sintered.

There is no particular restriction as to the concentration of the metal alkoxides or the metal acetylacetonates in the above solvent, so long as such metal compounds can be uniformly dissolved, dispersed or suspended in the solvent.

When at least one of Ba, Sr, Ca and Cu is used in the form of a metal alkoxide or a metal acetylacetonate, and such a metal alkoxide or a metal acetylacetonate dissolved, dispersed or suspended in the solvent is subjected to hydrolysis, it undergoes a change from a sol to a gel and finally forms the metal hydrate (hydroxide) or metal oxide particles. This method is a so-called sol-gel method and has features such that it is thereby possible to obtain super fine particles of the metal hydrate (hydroxide) or oxide and that it is thereby possible to obtain a homogeneous mixture of two or more metal hydrates (hydroxides) or oxides. Further, it is thereby possible to set the sintering temperature at a level lower than the dry method and the sintering time at a level shorter than the dry method.

By using highly pure metal alkoxides or metal acetylacetonates as mentioned above and highly pure water (such as deionized water or distilled water), it is possible to obtain particles (powder) of the metal hydrate (hydroxide) or oxide having a purity substantially higher than that attainable by the dry method.

The resulting sol and gel are usually amorphous as analyzed by X-ray analysis. However, it has been confirmed by experiments that they will be all readily converted to the corresponding metal oxides by sintering.

There is no particular restriction as to the concentration of the metal alkoxides or the metal acetylacetonates during the hydrolysis, the manner of addition of water or the conditions for the hydrolysis. The amount of water added for the hydrolysis may be at any level in excess of the stoichiometric amount for the hydrolysis of the metal alkoxides or the metal acetylacetonates, but is preferably in large excess. The reaction temperature is preferably at a level of the boiling point of the solvent, and the reaction time is preferably from 5 to 15 hours.

For the hydrolysis, an acid or a base, such as methoxy ethanol, ethanolamine, n-methyl ethanolamine, triethylamine, HCl, $HNO_3$ or $H_2SO_4$, may be added in a small amount, preferably in an amount of from 0.1 to 10 times the molar amount of the total of the starting materials to regulate the rate of the hydrolysis, to facilitate the sol-gel transformation or to increase the solubility prior to the hydrolysis.

The resulting hydrolyzates may be composed solely of metal oxides, but they may usually be amorphous hydrates (inclusive of hydroxides) in many cases, which can readily be converted to metal oxides by sintering at a relatively low temperature (200°–500° C.).

There is no particular restriction as to the manner of removing the solvent. The solvent may be removed by evaporation or filtration followed by drying.

There is no particular restriction as to the sintering conditions (such as the temperature, the number of times and the atmosphere). However, it is usual to employ a temperature of from 700° to 950° C., preferably from 800° to 900° C. and a time of from 1 to 20 hours, preferably from 1 to 8 hours, whereby the sintering can be conducted at a low temperature for a short period of time as compared with the conventional dry method.

In a seventh embodiment of the present invention, the metal elements for constituting the oxide system are Tl, Ca, Ba and Cu, and they are dissolved, dispersed or suspended in a solvent at least partly in the form of acetylacetonates with the rest, if any, being in the form of alkoxides, followed by removal of the solvent to obtain a homogeneous mixture, which is then sintered to obtain a superconductor of a Tl-Ca-Ba-Cu-O system. The uniformly dissolved, dispersed or suspended mixture may be hydrolyzed prior to the removal of the solvent.

The alkoxides and the acetylacetonates of the metal elements to be used in this embodiment are uniformly dissolved, dispersed or suspended in a solvent and then hydrolyzed by an addition of water, whereby they undergo a change from a sol to a gel and finally form particles of the metal hydrates (hydroxides) or oxides. This method is a so-called sol-gel method, which has been described in the foregoing.

As mentioned above, the metal alkoxides and the metal acetylacetonates may usually be obtained in a high purity at a level of from 99.999 to 99.99999%. Therefore, by using such high purity metal compounds and highly pure water (such as deionized water or distilled water), it is possible to obtain particles (powder) of metal hydrates (hydroxides) or oxides having a purity substantially higher than that attainable by the conventional dry method. Further, since uniformly mixed super fine particles are obtainable, there is a merit such that the sintering temperature can be made low and the reaction time can be made short as compared with the dry method.

The sol and the gel obtained by this method are usually amorphous as analyzed by the X-ray analysis, and it has been confirmed by experiments that they will be all converted to the metal oxides by sintering.

The alkoxides and the acetylacetonates of thallium, calcium, barium and copper used in this embodiment may be of any structures or forms. Namely, the alkoxy group constituting such a metal alkoxide may have any number of carbon atoms, and may be an alkoxy group from a polyhydric alcohol. Preferred specific examples of such an alkoxy group include a methoxy group, an ethoxy group, a propoxy group, an isopropoxy group, a butoxy group, a t-butoxy group, a sec-butoxy group and ethylene glycol. However, the alkoxy group is not limited to such specific examples.

Whereas, the acetylacetonates may be of any structures or forms so long as the basic structure is acetylacetonate. Namely, the hydrogen atom of the basic structure may be substituted by e.g. a halogen atom or an oxygen functional group. And they may have any number of carbon atoms.

Further, there is no particular restriction as to the number of alkoxy groups or acetylacetonate groups bonded to a metal element. At least one such group may be bonded to a metal element.

The solvent useful in this embodiment includes, for example, methyl alcohol, ethyl alcohol, isopropyl alcohol, butanol, benzene, toluene, xylene, tetrahydrofuran, diethyl ether, diphenyl ether, DMF, a primary amine, a secondary amine and a tertiary amine.

The hydrolysis and the sintering can be conducted in the same manner as described in the foregoing.

Now, the present invention will be described in further detail with reference to Examples. However, it should be understood that the present invention is by no means restricted to such specific Examples.

EXAMPLE 1 and COMPARATIVE EXAMPLES 1 and 2

So as to bring the composition of the desired superconductor of an oxide system to $(La_{0.9}Sr_{0.1})_2CuO_4$, acetylacetonates of La, Sr and Cu (each having a purity of at least 99.999%) were added in a predetermined ratio in a total amount of 50 g in 1 liter of tetrahydrofuran, and uniformly dispersed (partially dissolved). This dispersion was adjusted to 80° C. and subjected to hydrolysis by an addition of deionized water (200 ml) containing 0.1 g of NaOH, whereby gelled blackish brown precipitates were formed. The precipitates were collected by filtration, then washed with 30 ml of a solvent mixture of distilled water/acetone in a volume ratio of 1/1, dried and analyzed by an X-ray diffraction apparatus, whereby the precipitates were found to be composed mainly of a mixture of hydroxides of La, Sr and Cu and contain an amorphous substance of the respective oxides.

The dried product of the precipitates were presintered in an oxygen stream at 900° C. for 4 hours to obtain a porous presintered product. The presintered product was pulverized in a mortar and then formed into a pellet having a diameter of 10 mm and a thickness of 1.5 mm by means of a pelletizer. This pellet was again sintered in an oxygen stream at 920° C. for 6 hours to obtain a densely sintered product.

For the purpose of comparison, the above precipitates without being subjected to washing and a mixture of $La_2O_3$, $SrCO_3$ and CuO powders which were all guaranteed reagents, were, respectively, presintered and sintered in the same manner as above to obtain a pellet having the above washing step omitted and a pellet according to the conventional dry method (Comparative Examples 1 and 2).

With respect to three types of samples, the temperature dependency of the resistivity was measured by a four terminal method by placing each sample provided with four indium electrodes with a space of 1.5 mm from an another in a criostat and gradually cooling it with a liquefied helium. The results are shown in FIG. 1.

In FIG. 1, curve 1 shows the characteristics of the sample prepared by the process of the present invention, curve 2 shows the characteristics of the sample obtained in the same manner except that the washing step was omitted, and curve 3 shows the characteristics of the sample according to the conventional dry method.

From the results of FIG. 1, it is evident that as compared with the product of the conventional dry method, the superconductor of an oxide system prepared by the process of the present invention undergoes a quick transition to the superconducting state with its resistivity rapidly dropping to 0. Further, it is evident that the superconductivity is superior also as compared with Comparative Example 1 wherein the washing was omitted. The onset temperature at which the resistivity of each sample has started to rapidly decrease to the superconducting state, the offset temperature at which the resistivity has become 0 and the difference between the two temperatures (the transition temperature range) are shown in Table 1. Further, at the liquefied helium temperature (4.3 K), the voltage applied to each sample was raised to gradually increase the current, and the critical current density at which the superconducting state has been broken and turns to a normal conducting state, was measured and shown in Table 1.

TABLE 1

| Example No. | Method for the preparation of the sample | Onset temp. (K) | Offset temp. (K) | Transition temperature range (K) | Critical current density (A/cm$^2$) |
|---|---|---|---|---|---|
| Example 1 | Process of the present invention | 43.8 | 41.9 | 1.9 | 98.6 |
| Comparative Example 1 | Process wherein washing was omitted | 43.7 | 40.0 | 3.7 | 60.4 |
| Comparative Example 2 | Dry method | 43.6 | 37.3 | 6.3 | 27.4 |

From the results of Table 1, it is evident that the superconductor of an oxide system prepared by the process of the present invention has practically excellent superconducting characteristics such that as compared with the product having the washing step omitted and the product obtained by the conventional dry method, not only the critical temperature at which the resistivity becomes 0 is high, but also the range for transition from the normal conducting state to the superconducting state is narrow, and the critical current density is high.

With respect to the three types of the sintered samples, the structural analysis was conducted by e.g. the X-ray diffraction, whereby the sample by the process of the present invention was found to be a sintered product comprising a substantially uniform single phase of so-called K type $(La_{0.9}Sr_{0.1})_2CuO_4$. On the other hand, with the sample having the washing step omitted, the alkali metal was taken in as an impurity, and other phases were observed in addition to the superconductive phase. Further, the sample prepared by the conventional dry method was found to contain a perovskite structure of $ABO_3$ type (wherein A and B are metal elements) and relatively many other phases in addition to the $K_2NiF_4$ type phase.

The gelled hydrolyzate composed mainly of a mixture of hydroxides of La, Sr and Cu formed by the hydrolysis according to the process of the present invention and the sintered product thereof obtained by sintering it at a temperature of from 200° to 500°, were found to be composed of pure and uniform super fine particles at a level of from a few tens to few hundreds Å, respectively, by the analysis (observation by means of a scanning type electron microscope). Namely, such a nature is considered to effectively serve to obtain the sintered product of the desired composition.

EXAMPLE 2 and COMPARATIVE EXAMPLES 3 and 4

So as to bring the composition of the desired superconductor of an oxide system to $YBa_2Cu_3O_7$, acetylacetonates of Y, Ba and Cu were uniformly dispersed (partially dissolved) in a total amount of 6.0 g in 500 ml of ethyl alcohol at 80° C. To this dispersion, 500 ml of distilled water containing 40 mg of NaOH was dropwise added over a period of one hour to conduct the hydrolysis, whereby a gel of a mixture of the reaction products was obtained.

The gel thus obtained was dried and washed with 30 ml of a solvent mixture of ethanol/distilled water in a volume ratio of 3/1, and the dried product was preliminarily calcined in air at 500° C. for 3 hours. Then, the calcined product was presintered in an oxygen stream at 950° C. for 3 hours to obtain a coarse presintered product. The presintered product was pulverized and then formed into a pelletized sample in the same manner as in Example 1. This pellet was sintered in an oxygen stream at 950° C. for 9 hours in the same manner as in Example 1 to obtain a densely sintered product.

For the purpose of comparison, samples were prepared by using a mixture having the above washing step omitted and a mixture of $Y_2O_3$, $BaCO_3$ and CuO powders in the same manner as in Example 1 and subjected to the presintering and the sintering in the same manner as above to obtain two types of sintered products (Comparative Examples 3 and 4).

With respect to the three types of samples, the temperature dependency of the resistivity and the critical current density were measured in the same manner as in Example 1. The results are shown in FIG. 2 and Table 2.

Figure 2:
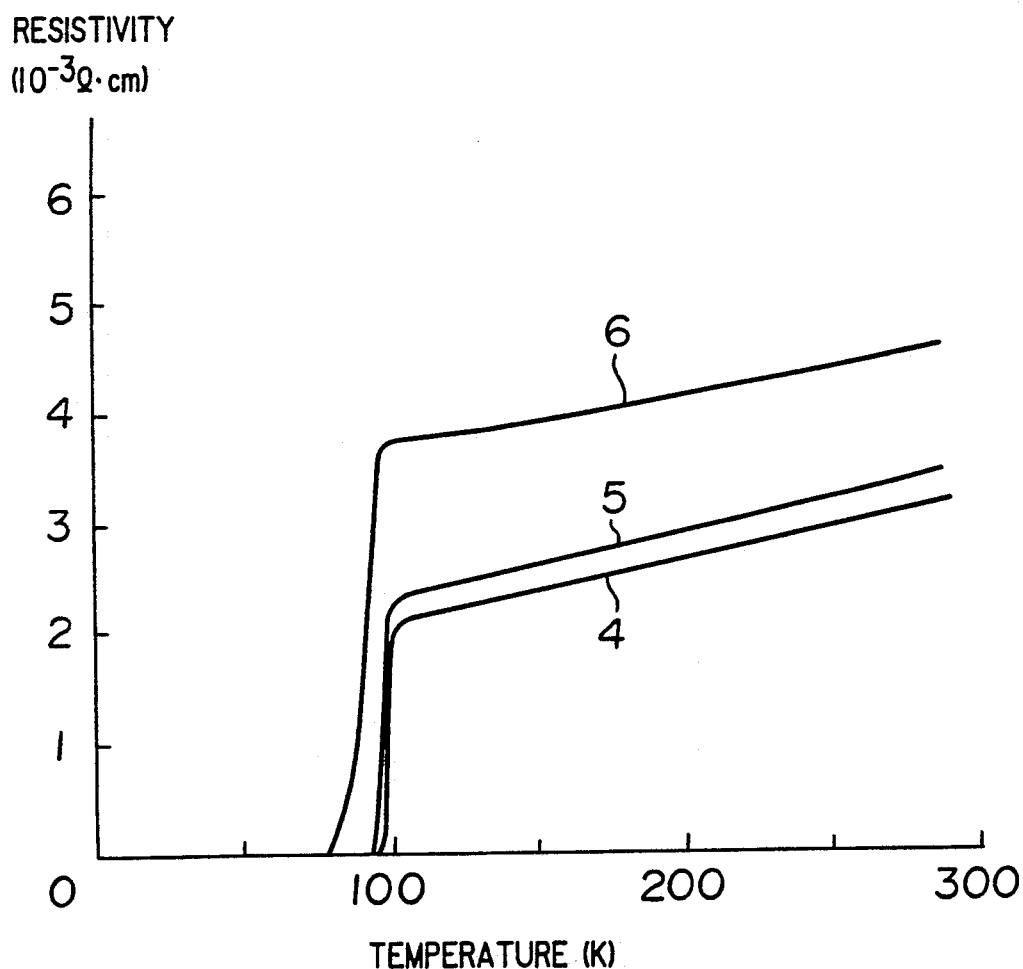
FIG. 2 is a graph showing the relation between the resistivity and the temperature of superconductors of an oxide system obtained in Example 2 (curve 4) and Comparative Examples 3 and 4 (curves 5 and 6).

In FIG. 2, curve 4 shows the characteristics by the process of the present invention, curve 5 shows the characteristics by the process wherein the washing step was omitted, and curve 6 shows the characteristics by the conventional dry method. The critical current density is (77.4 K).

TABLE 2

| Example No. | Method for the preparation of the sample | Onset temp. (K) | Offset temp. (K) | Transition temperature range (K) | Critical current density (A/cm$^2$) |
|---|---|---|---|---|---|
| Example 1 | Process of the present invention | 98.4 | 96.1 | 2.3 | 127.0 |
| Comparative Example 3 | Process wherein washing was omitted | 98.3 | 92.2 | 6.1 | 67.0 |
| Comparative Example 4 | Dry method | 97.4 | 76.1 | 21.3 | 22.4 |

From the results in FIG. 2 and in Table 2, it is evident that as compared with the product by the method wherein the washing step was omitted and the product by the conventional dry method, the superconductor of an oxide system prepared by the process of the present invention has practically excellent superconducting characteristics such that the critical temperature for the transition to the superconducting state is high, the transition temperature range is narrow, and the critical current density is high. Whereas, with the products by the process wherein the washing step was omitted and by the conventional dry method, the critical temperature, the transition temperature range and the critical current density are inadequate for practical application.

The poor characteristics of the product by the process wherein the washing step was omitted are attributable to the alkali metal taken in as an impurity and other phases are included in the superconductive phase. The poor characteristics of the product by the conventional dry method were found to be attributable to relatively many unwanted phases present in addition to the high temperature superconducting phase, as a result of the analysis such as the same X-ray diffraction method as used in Example 1.

Further, with respect to each sample used in Examples 1 and 2, the susceptibility was measured, whereby in each case, Meissner effects were observed at a temperature of not higher than the temperature at which the resistivity became 0.

EXAMPLE 3 and COMPARATIVE EXAMPLES 5 and 6

So as to bring the composition of the desired superconductor of an oxide system to YBa$_2$Cu$_3$O$_7$, acetylacetonates of Y, Ba and Cu were uniformly suspended (partially dissolved) in a total amount of 10 g in 500 ml of ethyl alcohol at 80° C. To this suspension, 500 ml of distilled water containing 5 ml of ammonia was dropwise added over a period of one hour to conduct the hydrolysis, whereby a gel of the mixture of products was obtained.

The gel thus obtained, was preliminarily baked in air at 500° C. for 2 hours and then presintered in an oxygen stream at 950° C. for 3 hours to obtain a coarse presintered product. The presintered product was pulverized in a mortar and formed into a pellet having a diameter of 10 mm and a thickness of 1.5 mm by means of a pelletizer. This pellet was again sintered in an oxygen stream at 900° C. for 8 hours to obtain a densely sintered product.

For the purpose of comparison, samples by the conventional dry method and by the coprecipitation method were prepared by using a mixture of Y$_2$O$_3$, BaCO$_3$ and CuO powders and nitrates of Y, Ba and Cu, which were all guaranteed reagents, respectively, and they were, respectively, presintered and sintered in the same manner as above to obtain two types of sintered products.

With respect to the three types of samples, the temperature dependency of the resistivity and the critical current density were measured in the same manner as in Example 1. The critical current density is a value measured at the liquefied nitrogen temperature (77.4 K). The results are shown in FIG. 3 and Table 3.

Figure 3:
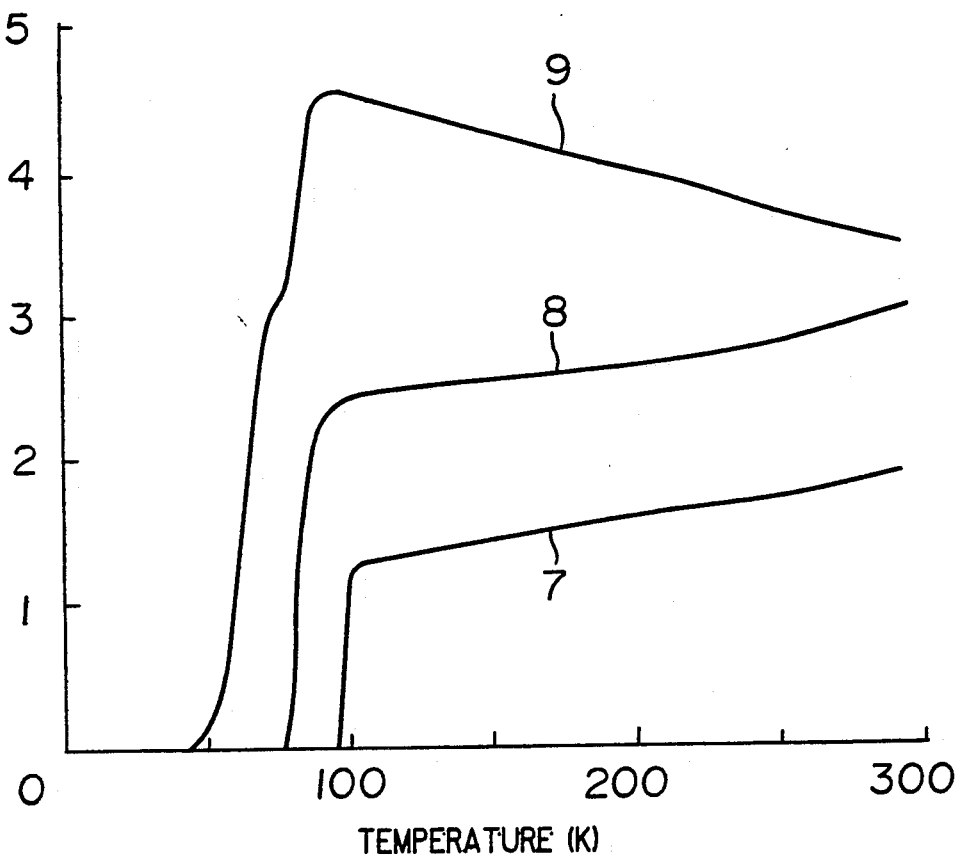
FIG. 3 is a graph showing the relation between the resistivity and the temperature of superconductors of an oxide system obtained in Example 3 (curve 7) and Comparative Examples 5 and 6 (curves 8 and 9).

In FIG. 3, curve 7 shows the characteristics by the process of the present invention, curve 8 shows the characteristics by the conventional dry method, and curve 9 shows the characteristics by the conventional coprecipitation method.

TABLE 3

| Example No. | Method for the preparation of the sample | Onset temp. (K) | Offset temp. (K) | Transition temperature range (K) | Critical current density (A/cm$^2$) |
|---|---|---|---|---|---|
| Example 3 | Process of the present invention | 98.6 | 95.5 | 3.1 | 127.4 |
| Comparative Example 5 | Dry method | 97.5 | 80.1 | 17.4 | 37.6 |
| Comparative Example 6 | Coprecipitation method | 92.7 | 42.5 | 50.2 | — |

From the results in FIG. 3 and Table 3, it is evident that as compared with the products of the conventional methods, the superconductor of an oxide system prepared by the process of the present invention has practically excellent superconducting characteristics such that the critical temperature for the transition to the superconducting state is high, the transition temperature range is narrow, and the critical current density is high. Whereas, with the products prepared by the conventional two methods, the critical temperature, the transition temperature range and the critical current density are inadequate for practical application. Especially the product by the coprecipitation method did not show superconductivity at the liquefied nitrogen temperature (77.4 K) although the composition was the same as the other two samples. The poor characteristics of the superconductors of an oxide system according to the conventional methods were found to be attributable to relatively many unwanted phases present in addition to the high temperature superconductive phase, as a result of the analysis such as X-ray diffraction.

EXAMPLE 4 and COMPARATIVE EXAMPLE 7

By using acetylacetonates of at least one element selected from the group consisting of Mg, Ca, Sr and Ba of Group IIa of the Periodic Table, at least one element selected from the group consisting of Sc, Y and lanthanoids of Group IIIa of the Periodic Table and Cu, experiments were conducted in the same manner as in Example 3. The combinations used include, for example, La-Sr-Ba-Cu, Y-La-Ba-Ca-Cu, Sc-Ba-Cu, Y-La-Ba-Cu, Y-Ba-Mg-Cu, Ho-Ba-Cu (Ho is holmium), Er-Ba-Cu (Er is erbium) and Yb-Ba-Cu (Yb is ytterbium).

At the same time, for the purpose of the comparison, sintered products having the same intended compositions as above were prepared by the conventional dry method and the coprecipitation method and evaluated.

As a result, it has been found that in each of the above combinations, a superconductor of an oxide system having a critical temperature of from 20 to 95 K can be prepared by the process of the present invention. In each case, the product by the process of the present invention had superior superconductivity as compared with the products by the conventional methods, as shown by the comparison between Example 3 and Comparative Examples 5 and 6.

With respect to each of the samples used in Examples 3 and 4, the susceptibility was measured, whereby in each case, Meissner effects were observed at a temperature of not higher than the temperature at which the resistivity became 0.

EXAMPLES 5 and 6 and COMPARATIVE EXAMPLES 8 and 9

So as to bring the composition of the desired superconductor of an oxide system to $YBa_2Cu_3O_7$, yttrium acetylacetonate (purity: at least 99.999%), barium acetylacetonate (purity: at least 99.999%) and copper stearate (purity: at least 99.9%) were added in a predetermined ratio in the total amount of 10 g to 1 liter of butanol and uniformly dispersed (partially dissolved). To this dispersion, 20 ml of distilled water containing 30 mg of NaOH was added, and the mixture was heated at 80° C. for 1 hour to hydrolyze the yttrium acetylacetonate and the Ba acetylacetonate, whereby a gelled mixture was obtained.

The gelled mixture was washed with deionized water until the water used for washing was substantially neutral and presintered in an oxygen atmosphere at 900° C. for 6 hours to obtain a porous presintered product. The presintered product was pulverized in a mortar and formed into a pellet having a diameter of 10 mm and a thickness of 2.0 mm by means of a pelletizer. This pellet was sintered in an oxygen atmosphere at 940° C. for 3 hours to obtain a densely sintered product (Example 5).

A sintered product was obtained in the same manner as in Example 5 except that washing with deionized water prior to the sintering was omitted (Example 6).

For the purpose of comparison, a mixture of $Y_2O_3$, $BaCO_3$ and CuO powders and a precipitate formed by adding small amounts of ammonia and oxalic acid to an aqueous solution of nitrates of Y, Ba and Cu, each prepared by using guaranteed reagents, were, respectively, presintered and sintered in the same manner as above, to obtain sintered products by the conventional dry method and the coprecipitation method (Comparative Examples 8 and 9).

With respect to each of the four types of samples, the temperature dependency of the resistivity was measured by a four terminal method. The results are shown in FIG. 4.

Figure 4:
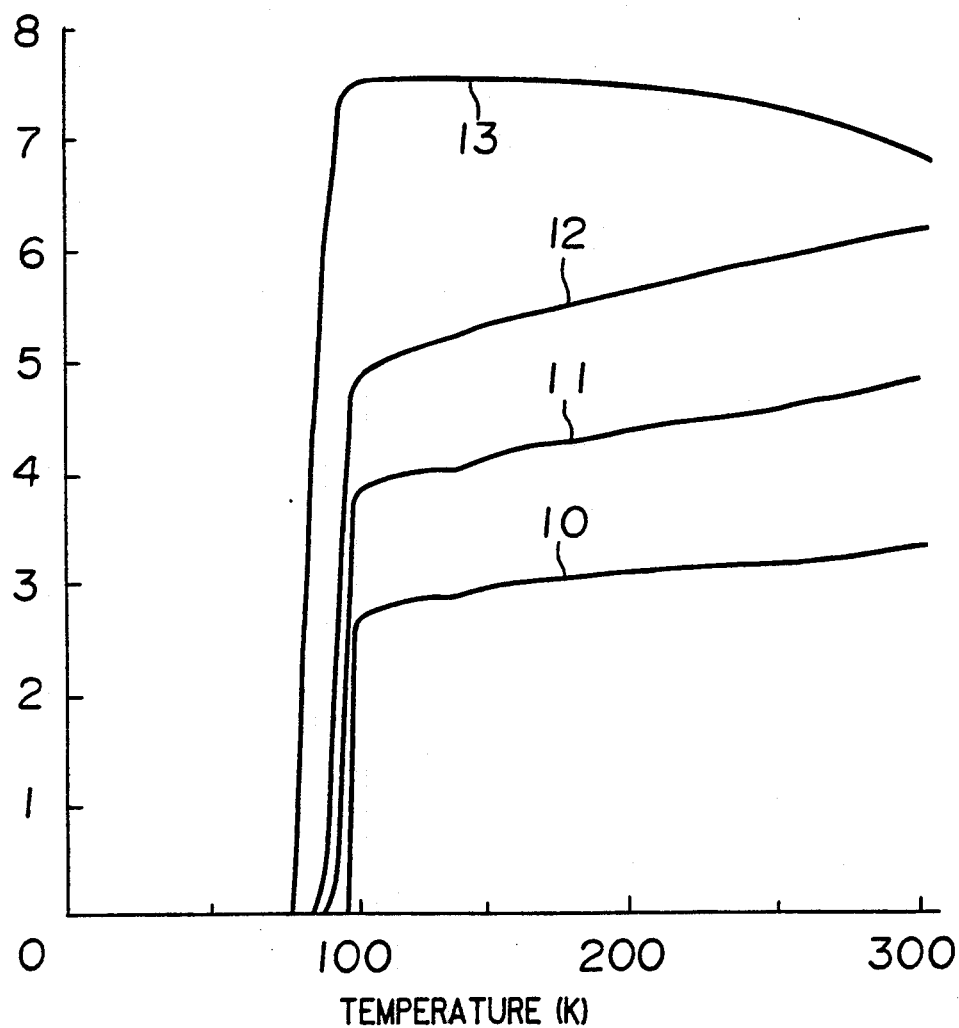
FIG. 4 is a graph showing the relation between the resistivity and the temperature of superconductors of an oxide system obtained in Examples 4 and 5 (curves 10 and 11) and Comparative Examples 7 and 8 (curves 12 and 13).

In FIG. 4, curve 10 shows the characteristics of the sample prepared by the process of the present invention wherein the washing was conducted prior to the sintering, curve 11 shows the characteristics of the sample prepared by the process of the present invention wherein the washing prior to the sintering was omitted, curve 12 shows the characteristics of the sample by the conventional dry method, and curve 13 shows the characteristics of the sample by the conventional coprecipitation method.

From FIG. 4, it is evident that as compared with the products by the conventional methods, the superconductor of an oxide system prepared by the process of the present invention undergoes a sharp transition to a superconducting state with the resistivity abruptly dropping to 0 when cooled. With respect to each sample, the onset temperature, the offset temperature and the transition temperature range are shown in Table 4. Further, the critical current density of each sample in the superconducting state (77.4 K) was obtained and shown in Table 4.

TABLE 4

| Example No. | Method for the preparation of the sample | Onset temp. (K) | Offset temp. (K) | Transition temperature range (K) | Critical current density (A/cm$^2$) |
|---|---|---|---|---|---|
| Example 5 | Process of the present invention including washing | 97.9 | 96.8 | 1.1 | 98.0 |
| Example 6 | Process of the present invention without washing | 97.2 | 94.2 | 3.0 | 92.4 |
| Comparative Example 8 | Dry method | 94.2 | 90.0 | 4.2 | 36.5 |
| Comparative Example 9 | Coprecipitation method | 91.7 | 79.2 | 12.5 | 10.6 |

From the results in Table 4, it is evident that as compared with the products by the conventional methods, the superconductors of an oxide system prepared by the process of the present invention have practically excellent superconducting characteristics such that not only the temperature at which the resistivity drops completely to 0 is high, but also the range for the transition from the normal conducting state to the superconducting state is narrow, and the critical current density is very high. Whereas, with the products prepared by the conventional methods, particularly by the coprecipitation method, the offset temperature, the transition temperature range and the critical current density are all inadequate for practical application.

Further, among the products of the present invention, the one obtained by the process including the washing prior to the sintering is superior in the offset temperature, the transition temperature range and the critical current density to the one obtained by the process wherein the washing step was omitted.

With respect to each of the four types of sintered product samples, the structural analysis was conducted by e.g. the X-ray diffraction method, whereby each of the products obtained by the process of the present invention was found to be a sintered product composed of a substantially uniform single phase of a so-called oxygen-deficient type perovskite structure. On the other hand, the products by the conventional dry method and the coprecipitation method were found to contain relatively large proportions of other phases in addition to the oxygen-deficient type perovskite structure. Especially the product by the coprecipitation method was found to have the ratio of elements deviated from the desired composition. Thus, the poor characteristics of the superconductors of an oxide system according to the conventional methods as shown in FIG. 4 and Table 4, are considered to be attributable to the deviation of the composition and the presence of other phases than the high temperature superconductive phase.

It has been found by the analysis (observation by means of a scanning type electron microscope) that in the process of the present invention, the gelled hydrolyzate composed mainly of yttrium hydroxide, barium hydroxide, copper stearate and copper oxide formed by the hydrolysis in Example 5 and the sintered product thereof obtained by sintering at a temperature of from 200° to 500° C., are composed of pure uniform super fine particles of a few tens to a few hundreds Å. Namely, such a nature is considered to effectively serve to obtain the sintered product of the desired composition.

EXAMPLES 7 and 8 and COMPARATIVE EXAMPLE 10

So as to bring the composition of the desired superconductor of an oxide system to $(La_{0.92}Sr_{0.08})_2CuO_4$, copper acetylacetonate, strontium acetylacetonate and lanthanum oleate were uniformly dispersed (partially dissolved) in a total amount of 8 g in 1 liter of butanol. This dispersion was subjected to hydrolysis by an addition of 10 ml of distilled water containing 30 mg of KOH, whereby a gelled mixture was obtained.

The gelled mixture was washed with deionized water until the water used for the washing was substantially neutral, then dried at 100° C. for 4 hours and presintered in an oxygen atmosphere at 950° C. for 6 hours. The presintered product thus obtained was pulverized and formed into a pelletized sample in the same manner as in Example 5. Then, the pelletized sample was sintered in an oxygen atmosphere at 950° C. for 2 hours to obtain a densely sintered product (Example 7).

Further, a sintered product was prepared in the same manner as in Example 7 except that the washing with deionized water prior to the sintering was omitted (Example 8).

For the purpose of comparison, a sample by the conventional dry method was prepared by using $La_2O_3$, $SrCO_3$ and CuO powders in the same manner as in Example 5 and presintered and sintered in the same manner as above to obtain a sintered product (Comparative Example 10).

With respect to the three types of samples, the temperature dependency of the resistivity and the critical current density were measured in the same manner as in Example 5. The results are shown in FIG. 5 and Table 5.

Figure 5:
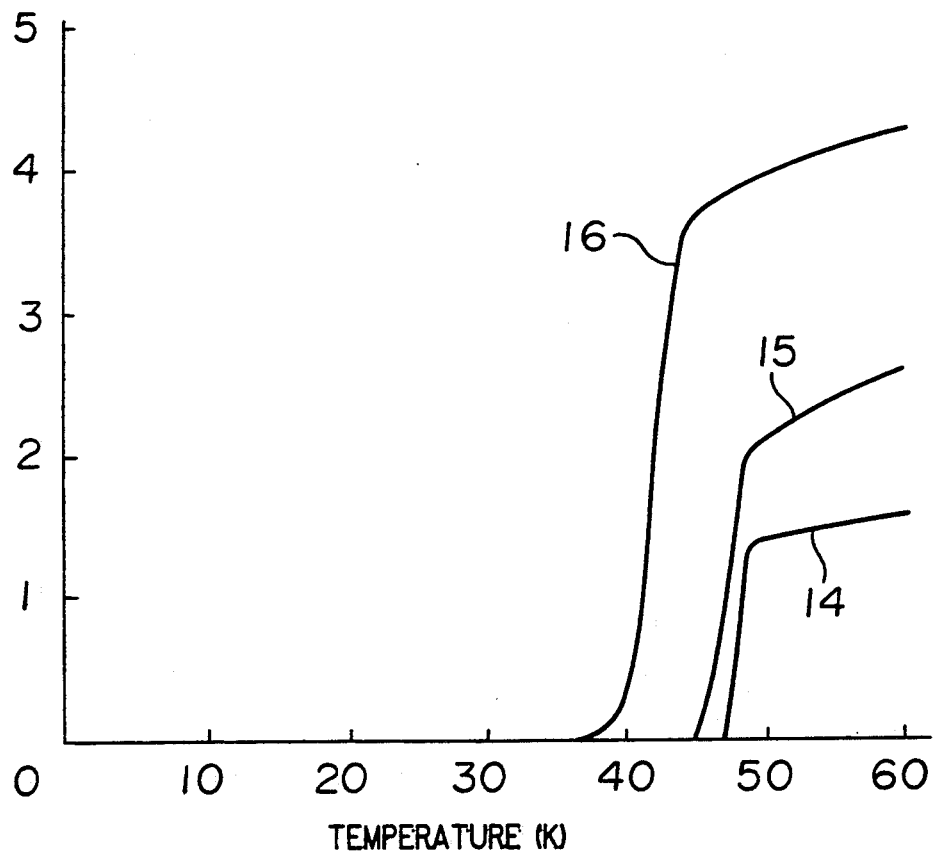
FIG. 5 is a graph showing the relation between the resistivity and the temperature of superconductors of an oxide system obtained in Examples 6 and 7 (curves 14 and 15) and Comparative Example 9 (curve 16).

In FIG. 5, curve 14 shows the characteristics by the process of the present invention wherein the washing was conducted prior to the sintering, curve 15 shows the characteristics by the process of the present invention wherein the washing prior to the sintering was omitted, and curve 16 shows the characteristics by the conventional dry method. The critical current density is the value measured at the liquefied helium temperature (4.2 K).

TABLE 5

| Example No. | Method for the preparation of the sample | Onset temp. (K) | Offset temp. (K) | Transition temperature range (K) | Critical current density (A/cm²) |
|---|---|---|---|---|---|
| Example 7 | Process of the present invention including washing | 47.9 | 47.0 | 0.9 | 79.9 |
| Example 8 | Process of the present invention without washing | 47.0 | 44.1 | 2.9 | 75.0 |
| Comparative Example 10 | Dry method | 43.6 | 37.3 | 6.3 | 27.4 |

From the results in FIG. 5 and Table 5, it is evident that as compared with the product by the conventional method, the superconductors of an oxide system prepared by the process of the present invention have practically excellent superconducting characteristics such that the critical temperature is high, the transition temperature range is narrow and the critical current density is high. Whereas, with the product prepared by the conventional dry method, the critical temperature, the transition temperature range and the critical current density are all inadequate for practical application.

The poor characteristics of the superconductor of an oxide system prepared by the conventional dry method have been found to be attributable to the relatively large content of unwanted phases other than the high temperature superconductive phase.

Further, with respect to each of the samples obtained susceptibility was measured, whereby in each case Meissner effects were observed at a temperature of not higher than the temperature at which the resistivity became 0.

Figure 6:
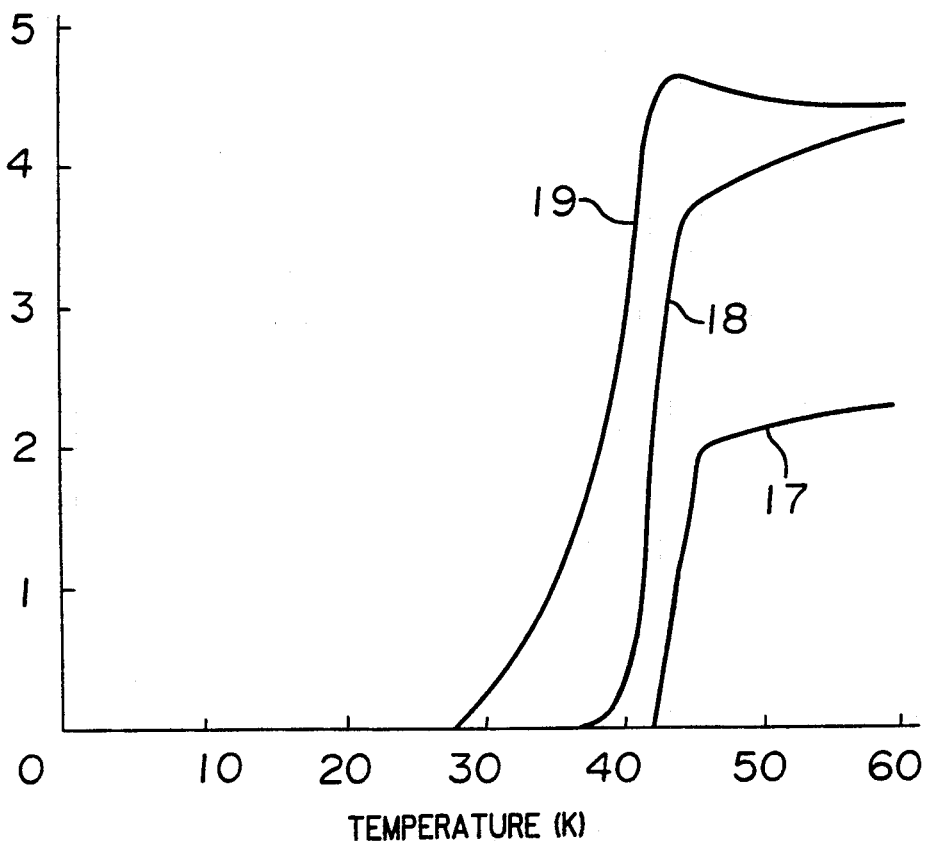
FIG. 6 is a graph showing the relation between the resistivity and the temperature of superconductors of an oxide system obtained in Example 8 (curve 17) and Comparative Examples 10 and 11 (curves 18 and 19).

In FIG. 6, curve 17 shows the characteristics of the sample prepared by the process of the present invention, curve 18 shows the characteristics of the sample prepared by the conventional dry method, and curve 19 shows the characteristics of the sample prepared by the conventional coprecipitation method.

From FIG. 6, it is evident that as compared with the products by the conventional methods, the superconductor of an oxide system prepared by the process of the present invention undergoes a sharp transition to the superconducting state with the resistivity abruptly dropping to 0 when cooled. With respect to each sample, the onset temperature, the offset temperature and the transition temperature range were measured and shown in Table 6. Further, the critical current density of each sample at the liquefied helium temperature (4.3 K) was obtained and shown in Table 6.

TABLE 6

| Example No. | Method for the preparation of the sample | Onset temp. (K) | Offset temp. (K) | Transition temperature range (K) | Critical current density (A/cm$^2$) |
|---|---|---|---|---|---|
| Example 9 | Process of the present invention | 44.2 | 42.2 | 2.0 | 60.7 |
| Comparative Example 11 | Dry method | 43.6 | 37.3 | 6.3 | 27.4 |
| Comparative Example 12 | Coprecipitation method | 42.7 | 28.0 | 14.7 | 15.1 |

EXAMPLE 9 and COMPARATIVE EXAMPLES 11 and 12

So as to bring the composition of the desired superconductor of an oxide system to $(La_{0.9}Sr_{0.1})_2CuO_4$, copper acetylacetonate (purity: at least 99.999%), lanthanum acetylacetonate (purity: at least 99.999%) and $SrCO_3$ (purity at least 99.9%) were used in a predetermined ratio. Ten mmol of copper acetylacetonate and 18 mmol of lanthanum acetylacetonate were added to 1 liter of tetrahydrofuran and uniformly dispersed (partially dissolved). This dispersion was adjusted to 60° C., and 0.5 ml of triethylamine was added thereto. Then, the hydrolysis was conducted by dropwise adding deionized water in large excess (200 ml) over a period of hour, whereby a blackish brown gel was formed. To this gel, 2 mmol of $SrCO_3$ was added and uniformly mixed. Then, the mixture was heated to 80° C. under stirring to evaporate the solvent and water to obtain a dried mixture.

The dried mixture was presintered in oxygen at 900° C. for 4 hours to obtain a porous presintered product. The presintered product was pulverized in a mortar and formed into a pellet having a diameter of 10 mm and a thickness of 1.5 mm by means of a pelletizer. This pellet was again sintered in oxygen at 930° C. for 2 hours to obtain a densely sintered product.

For the purpose of comparison, a mixture of $La_2O_3$, $SrCO_3$ and CuO powders and a precipitate formed by adding small amounts of ammonia and oxalic acid to an aqueous solution of nitrates of La, Sr and Cu, each prepared by using guaranteed reagents, were, respectively, presintered and sintered in the same manner as above to obtain sintered products by the conventional dry method and the coprecipitation method.

With respect to each of the three types of samples thus obtained, the temperature dependency of the resistivity was measured by a four terminal method. The results are shown in FIG. 6.

From the results in Table 6, it is evident that as compared with the products by the conventional methods, the superconductor of an oxide system prepared by the process of the present invention has practically excellent superconducting characteristics such that the temperature at which the resistivity drops to 0 is high, the range for the transition from the normal conducting state to the superconducting state is very narrow and the critical current density is very high. Whereas, with the products by the conventional methods, particularly by the coprecipitation method, the offset temperature, the transition temperature range and the critical current density are all inadequate for practical application.

With respect to each of the above three types of sintered product samples, the structural analysis was conducted by e.g. the X-ray diffraction method, whereby the product prepared by the process of the present invention was found to be composed of a substantially uniform single phase of a so-called K type ($La_{0.9}Sr_{0.1}$). On the other hand, the products by the conventional dry method and the coprecipitation method were found to contain relatively large proportions of a perovskite structure of $ABO_3$ type (wherein A and B are L metal elements) and other phases in addition to the $K_2NiF_4$ type phase. Especially the product by the coprecipitation method was found to have the ratio of elements substantially deviated from the desired composition. Thus, the poor characteristics of the superconductors of an oxide system prepared by the conventional methods as shown in FIG. 6 and Table 6, are considered to be attributable to the presence of such other phases and such compositional deviation.

The gelled hydroxides of Cu and La formed by the hydrolysis according to the process of the present invention were found to be pure uniform super fine particles of from a few tens to a few hundreds Å by the analysis (observation by a scanning type electron microscope). Namely, such a nature is considered to effectively serve to obtain the sintered product of the desired composition.

Further, the critical current density is the value as measured at the liquefied nitrogen temperature (77.4 K).

TABLE 7

| Example No. | Method for the preparation of the sample | Onset temp. (K) | Offset temp. (K) | Transition temperature range (K) | Critical current density (A/cm$^2$) |
|---|---|---|---|---|---|
| Example 10 | Process of the present invention including washing | 97.5 | 96.8 | 0.7 | 136 |
| Example 11 | Process of the present invention without washing | 97.4 | 96.0 | 1.4 | 108 |
| Comparative Example 13 | Dry method | 94.0 | 90.0 | 4.0 | 31.0 |
| Comparative Example 14 | Coprecipitation method | 92.5 | 83.0 | 9.5 | 30.0 |

EXAMPLES 10 and 11 and COMPARATIVE EXAMPLES 13 and 14

So as to bring the composition of the desired superconductor of an oxide system to $YBa_2Cu_3O_7$, yttrium acetylacetonate, barium acetylacetonate and CuO were used in a predetermined ratio. Ten mmol of yttrium acetylacetonate and 20 mmol of barium acetylacetonate were uniformly dispersed (partially dissolved) in 500 ml of benzene at 80° C. Then, hydrolysis was conducted by adding 30 ml of distilled water containing 5 mg of NaOH to this dispersion and heating it for 5 hours at 80° C., whereby a CuO was uniformly mixed. The homogeneous mixture thus obtained was washed with deionized water until the water used for washing was substantially neutral. Then, the washed mixture was left to stand at room temperature and in an atmosphere of 80° C. to evaporate water and the solvent. The dried product thus obtained was preliminarily calcined at 900° C. for 4 hours in oxygen and then presintered in oxygen at 940° C. for 6 hours to obtain a coarse presintered product. The presintered product was pulverized and formed into a pelletized sample in the same manner as in Example 9. This pellet was sintered in oxygen at 950° C. for 2 hours to obtain a densely sintered product (Example 10).

Further, a sintered product was prepared in the same manner as in Example 10 except that the washing with deionized water prior to the sintering was omitted.

For the purpose of comparison, samples by the conventional dry method and the coprecipitation method were prepared by using a mixture of $Y_2O_3$, $BaCO_3$ and CuO powders and nitrates of Y, Ba and Cu, respectively, in the same manner as in Example 9 and presintered and sintered in the same manner as above to obtain two types of sintered products.

Figure 7:
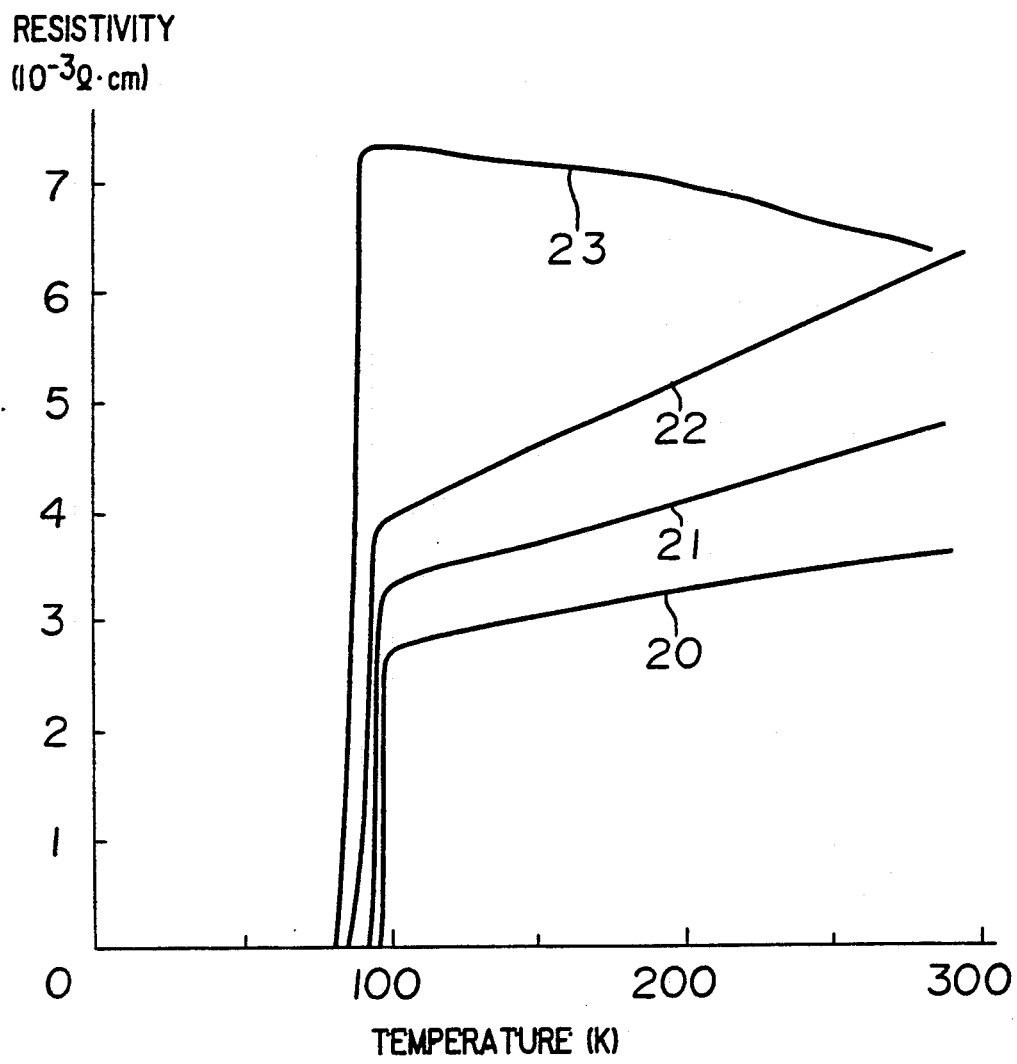
FIG. 7 is a graph showing the relation between the resistivity and the temperature of superconductors of an oxide system obtained in Examples 9 and 10 (curves 20 and 21) and Comparative Examples 12 and 13 (curves 22 and 23).

With respect to each of the four types of samples, the temperature dependency of the resistivity and the critical current density were measured in the same manner as in Example 9. The results are shown in FIG. 7 and Table 7. In FIG. 7, curve 20 shows the characteristics by the process of the present invention wherein the washing was conducted prior to the sintering, curve 21 shows the characteristics by the process of the present invention wherein no washing was conducted prior to the sintering, curve 22 shows the characteristics by the conventional dry method, and curve 23 shows the characteristics by the conventional coprecipitation method From the results in FIG. 7 and Table 7, it is evident that as compared with the products by the conventional methods, the superconductors of an oxide system prepared by the process of the present invention have practically excellent superconducting characteristics such that the critical temperature for the transition to the superconducting state is high, the transition temperature range is narrow and the critical current density is high. It is also evident that among the products of the present invention, the one prepared by the process wherein washing was conducted prior to the sintering was superior to the one prepared by the process wherein the washing was omitted, in the offset temperature, the transition temperature range and the critical current density. Whereas, with the products prepared by the conventional two methods, the critical temperature, the transition temperature range and the critical current density are all inadequate for practical application.

The poor characteristics of the superconductors of an oxide type by the conventional methods were found to be attributable to the relatively large content of unwanted phases other than the high temperature superconductive phase, as a result of the analysis by e.g. the X-ray diffraction method as in Example 9.

Further, with respect to each of the samples used in Examples 9 to 11, the susceptibility was measured, whereby in each case, Meissner effects were observed at a temperature of not higher than the temperature at which the resistivity became 0.

EXAMPLE 12 and COMPARATIVE EXAMPLES 15 and 16

So as to bring the composition of the desired superconductor of an oxide system to $YBa_2Cu_3O_7$, 10 mmol of $(CH_3CH_2CH_2O)_3Y$, 20 mmol of

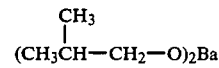

and 30 mmol of $(CH_3CH_2CH_2CH_2CH_2O)_2Cu$ were suspended in 300 ml of tetrahydrofuran (THF) under an argon gas stream. Then, 100 ml of a THF mixed solution containing 130 mmol of dry acetone was added thereto at 40° C., and the mixture was stirred at 40° C. for 3 hours.

Then, 130 mmol of ethyl acetate was added thereto, and the mixture was stirred at room temperature for 1 hour. Then, 50 ml of THF containing 200 mmol of $H_2O$ was gradually added thereto for hydrolysis, whereby a mixture containing a gelled product was obtained.

The solvent was distilled off, and the dried mixture was presintered in an oxygen stream at 900° C. for 4 hours to obtain a porous presintered product. The presintered product was pulverized in a mortar and formed into a pellet having a diameter of 10 mm and a thickness of 1.5 mm by means of a pelletizer. This pellet was again sintered in an oxygen stream at 900° C. for 8 hours to obtain a densely sintered product.

For the purpose of comparison, a mixture obtained in the same manner as in Example 12 except that a mixture of yttrium acetylacetonate, barium acetylacetonate and Cu acetylacetonate was used and a precipitate formed by adding small amounts of ammonia and oxalic acid to an aqueous solution of nitrates of Y, Ba and Cu to bring the composition of the desired superconductor of an oxide system to $YBa_2Cu_3O_7$, were, respectively, presintered and sintered in the same manner as above to obtain the sintered products by the process wherein a mixture of the respective metal acetylacetonates was used and by the conventional coprecipitation method.

With respect to each of the three types of samples, the temperature dependency of the resistivity was measured by a four terminal method. The results are shown in FIG. 8.

Figure 8:
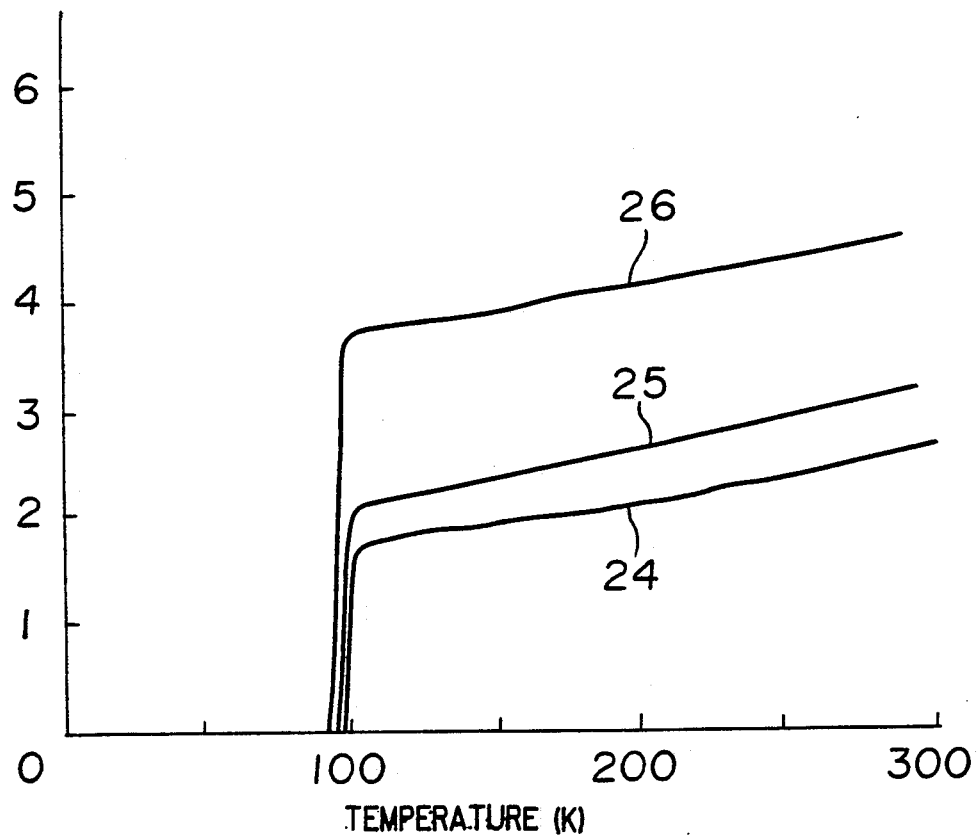
FIG. 8 is a graph showing the relation between the resistivity and the temperature of superconductors of an oxide system obtained in Example 11 (curve 24) and Comparative Examples 14 and 15 (curves 25 and 26).

In FIG. 8, curve 24 shows the characteristics of the sample prepared by the process of the present invention, curve 25 shows the characteristics of the sample prepared by the process wherein a mixture of the respective acetylacetonates was used, and curve 26 shows the characteristics of the sample prepared by the conventional coprecipitation method.

From FIG. 8, it is evident that as compared with the products of Comparative Examples, the superconductor of an oxide system prepared by the process of the present invention undergoes a sharp transition to the superconducting state with an abrupt drop of the resistivity to 0 when cooled. With respect to each sample, the onset temperature, the offset temperature and the transition temperature range were measured and shown in Table 8. Further, the critical current density of each sample at the liquefied nitrogen temperature (77.4 K) was measured and shown in Table 8.

process of the present invention has practically excellent characteristics such that the temperature at which the resistivity drops to 0 is high, the range for the transition from the normal conducting state to the superconducting state is narrow, and the critical current density is high. Whereas, especially with the product by the coprecipitation method, the offset temperature, the transition temperature range and the critical current density are all inadequate for practical application.

With respect to each of the above three types of sintered product samples, the structural analysis was conducted by e.g. the X-ray diffraction method, whereby the product by the process of the present invention was found to have a uniform single phase with a three layer oxygen-deficient perovskite structure. proportion of other phases in addition to the high temperature superconductive phase, and the deviation in the elemental ratio from the desired composition was found to be substantial.

The poor characteristics of the superconductor of an oxide system prepared by the conventional coprecipitation method, as shown in FIG. 8 and Table 8, are considered to be attributable to such a compositional deviation.

The hydrolyzate composed mainly of a gelled mixture of hydroxides of Y, Ba and Cu formed by the hydrolysis according to the process of the present invention and the sintered product thereof obtained by sintering it at a temperature of from 200° to 500° C., were found to be composed of pure uniform super fine particles of from a few tens to a few hundreds Å by the analysis (observation by a scanning type electron microscope). Namely, such a nature is considered to effectively serve to obtain the sintered product of the desired composition.

EXAMPLE 13 and COMPARATIVE EXAMPLE 17

So as to bring the composition of the desired superconductor of an oxide system to $(La_{0.9}Sr_{0.1})_2CuO_4$, 18 mmol of $La(OC_2H_5)$ 2 mmol of $Sr(OC_2H_5)_2$ and 10 mmol of was stirred at 50° C. for 10 hours. Then, the hydrolysis was conducted by gradually adding 50 ml of an ethanol solution containing 10 g of distilled water, whereby a mixture containing a gelled product was obtained.

The solvent was removed, and the mixture thereby obtained was preliminarily baked at 500° C. for 2 hours,

TABLE 8

| Example No. | Method for the preparation of the sample | Onset temp. (K) | Offset temp. (K) | Transition temperature range (K) | Critical current density (A/cm$^2$) |
|---|---|---|---|---|---|
| Example 12 | Process of the present invention | 98.8 | 97.9 | 0.9 | 157.6 |
| Comparative Example 15 | Process wherein a mixture of the respective metal acetylacetonates was used | 98.6 | 95.5 | 3.1 | 127.4 |
| Comparative Example 16 | Coprecipitation method | 91.2 | 86.3 | 4.9 | 32.0 |

From the results in FIG. 8 and Table 8, it is evident that as compared with the process wherein the respective metal elements are mixed in the form of the metal acetylacetonates or the coprecipitation method, the superconductor of an oxide system prepared by the and presintered in an oxygen atmosphere at 950° C. for 3 hours to obtain a coarse presintered product. The presintered product thus obtained was pulverized and then formed into a pelletized sample in the same manner as in Example 12. This pellet was sintered in an oxygen atmosphere at 950° C. for 8 hours to obtain a densely sintered product in the For the purpose of comparison, a mixture obtained in the same manner as in Example 13 except that a mixture of lanthanum acetylacetonate, strontium acetylacetonate and copper acetylacetonate was used to bring the composition of the desired superconductor of an oxide system to $(La_{0.9}Sr_{0.1})_2CuO_4$, was presintered and sintered in the same manner as above to obtain a sintered product.

With respect to each of the two types of samples, the temperature dependency of the resistivity and the critical current density were measured in the same manner as in Example 12. The results are shown in FIG. 9 and Table 9.

Figure 9:
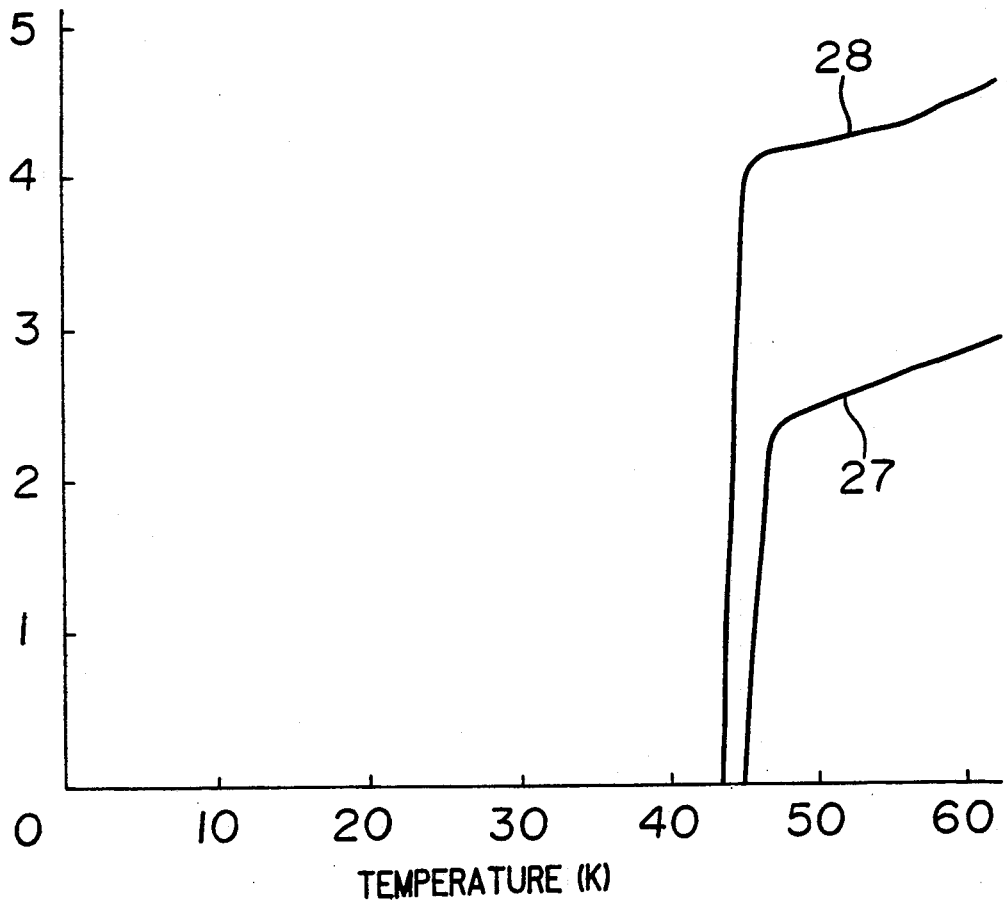
FIG. 9 is a graph showing the relation between the resistivity and the temperature of superconductors of an oxide system obtained in Example 12 (curve 27) and Comparative Example 16 (curve 28).

In FIG. 9, curve 27 is the characteristics of the product prepared by the process of the present invention, and curve 28 is the characteristics of the product prepared by the process wherein the mixture of acetylacetonates was used. The critical current density is the value measured at the liquefied helium temperature (4.3 K).

TABLE 9

| Example No. | Method for the preparation of the sample | Onset temp. (K) | Offset temp. (K) | Transition temperature range (K) | Critical current density (A/cm$^2$) |
|---|---|---|---|---|---|
| Example 13 | Process of the present invention | 45.6 | 44.9 | 0.7 | 160.4 |
| Comparative Example 17 | Process wherein a mixture of acetyl-acetonates was used | 43.8 | 41.8 | 2.0 | 98.7 |

From the results in FIG. 9 and Table 9, it is evident that as compared with the product prepared by the process wherein a mixture of the respective metal acetylacetonates is used, the superconductor of an oxide system prepared by the process of the present invention has superior superconducting characteristics. The poor superconducting characteristics of the superconductor of an oxide system prepared by the process wherein a mixture of the respective metal acetylacetonates was used, are considered to be attributable to the non-homogeneous mixing of the metal elements.

With respect to each of the samples used in Examples 12 and 13, the susceptibility was measured, whereby in each case, Meissner effects were observed at a temperature of not higher than the temperature at which the resistivity became 0.

EXAMPLE 14 and COMPARATIVE EXAMPLE 18

So as to bring the composition of the desired Bi-Sr-Ca-Cu-O superconductor to $Bi_1Sr_1Ca_1Cu_2Ox$, Bi-$(OC_2H_5)_3$, $Sr(OC_4H_9)_2$, $Ca(OC_4H_9)_2$ and $Cu(CH_3COCHCOCH_3)_2$ (each having a purity of at least 99.999%) were added in a predetermined ratio in a total amount of 4 g in 500 ml of butanol. Further, 0.1 ml of methoxyethanol and 0.1 ml of ethanolamine were added thereto. Then, the mixture was refluxed for 24 hours, and then 10 ml of distilled water was added thereto over a period of 30 minutes. The mixture was further refluxed for 24 hours to obtain blackish brown particles.

The product thus obtained was analyzed by means of an X-ray diffraction apparatus and found to be an amorphous mixture of Bi, Sr, Ca and Cu.

The product was concentrated under reduced pressure to remove the solvent, dried at 300° C. for 1 hour and then formed into a pellet having a diameter of 10 mm and a thickness of 1.5 mm by a pelletizer. This pellet was sintered in an oxygen stream at 900° C. for 8 hours to obtain a densely sintered product.

For the purpose of the comparison, a mixture of $Bi_2O_3$, $SrCO_3$, CaO and CuO powders which were all guaranteed reagents, was sintered in the same manner as above to obtain a sintered product according to the conventional dry method.

With respect to the two types of samples, the temperature dependency of the resistivity was measured by a four terminal method. The results are shown in Table 10 and FIG. 10.

Figure 10:
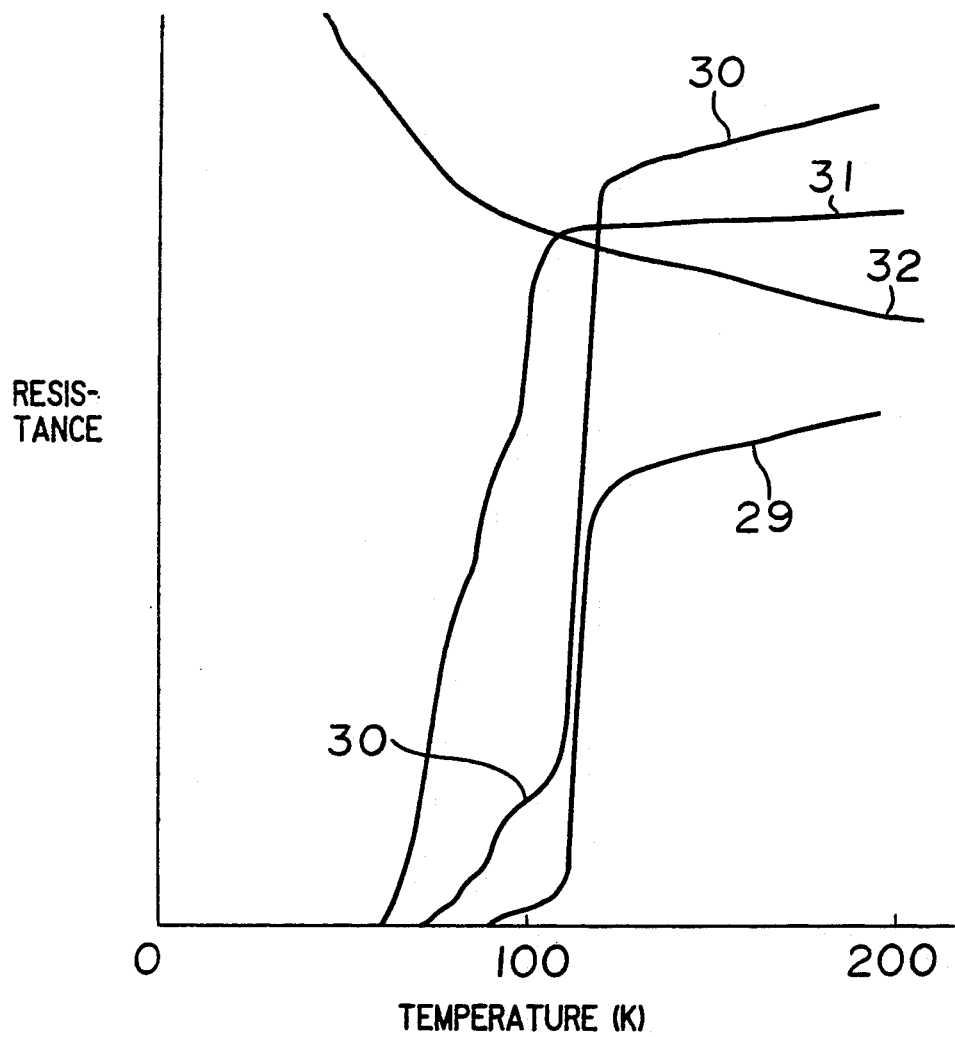
FIG. 10 is a graph showing the relation between the resistivity and the temperature of superconductors of a Bi-Sr-Ca-Cu-O system obtained in Example 13 (curve 29) and Comparative Example 17 (curve 30) and of superconductors of a Bi-Sr-Ca-Cu-O system prepared by changing the sintering temperature to 700° C. in Example 10 (curve 31) and Comparative Example 17 (curve 32).

In FIG. 10, curve 29 shows the characteristics of the sample prepared by the process of the present invention, and curve 30 shows the characteristics of the sample prepared by the conventional dry method.

TABLE 10

| Example No. | Onset (K) | Offset (K) |
|---|---|---|
| Example 14 | 125 | 86 |
| Comparative Example 18 | 120 | 70 |

From the results in Table 10 and FIG. 10, it is evident that as compared with the product prepared by the conventional method, the Bi-Sr-Ca-Cu-O superconductor prepared by the process of the present invention has a high critical temperature and exhibits superior superconductivity.

With respect to the above two types of sintered product samples, the structural analysis was conducted by the X-ray diffraction method, and they were considered to be polymorphic. However, the intensity in the X-ray diffraction was distinctly stronger with the product prepared by the process of the present invention, thus indicating that the crystallization was more advanced. (When measured under the same conditions, the intensity of the peak of the product prepared by the dry method was about 1/4 time.)

Further, a study has been made by changing the sintering temperature to 500° C., 600° C., 700° and 800° C. From the results of the X-ray diffraction, it is evident that according to the process of the present invention, the crystallization was adequately advanced even at 700° C. Whereas, in the dry method, heating at a temperature of about 900° C. is required to obtain a sintered product capable of undergoing a transition to superconductivity. Thus, it is evident that the process of the present invention wherein a superconductor is synthesized from a liquid phase is far superior.

Sintered products were prepared in the same manner as in Example 14 and Comparative Example 18 except that the sintering temperature was changed to 700° C., and the resistance of such sintered products were measured. The results are shown by curves 31 and 32 in FIG. 10. From FIG. 10, it is evident that by the synthesis in accordance with the dry method, the product sintered at 700° C. shows $\eta$-T characteristics of a semiconductor behavior and does not show a transition to superconductivity, whereas the sintered product according to the process of the present invention shows an onset temperature of 95 K and an offset temperature of 60 K.

With respect to the samples obtained in Example 14 and Comparative Example 18, the susceptibility was measured, whereby in each case, Meissner effects were observed at the offset temperature.

What is claimed is:

1. A process for producing a superconductor of an oxide system, which comprises:
    (a) uniformly mixing metal elements for constituting the oxide system at least partly in the form of acetylacetonates in a solvent, to obtain a substantially homogeneous mixture,
    (b) hydrolyzing said mixture with an alkaline substance, to form a gelled hydrolyzate,
    (c) washing said gelled hydrolyzate to remove said alkaline substance therefrom,
    (d) drying said washed hydrolyzate, and
    (e) sintering said dried hydrolyzate to form said superconductor of an oxide system.

2. The process according to claim 1, wherein the metal elements for constituting the oxide system are at least one element selected from the group consisting of Mg, Ca, Sr and Ba of Group IIa of the Periodic Table, at least one element selected from the group consisting of Sc, Y and lanthanoids of Group IIIa of the Periodic Table, and Cu.

3. The process according to claim 2, wherein a part of the metal elements are dissolved, dispersed or suspended in the form of acetylactones and then hydrolyzed with an alkali to obtain a hydrolyzate, and the rest of the metal elements are uniformly mixed with the hydrolyzate in the form of carboxylates.

4. The process according to claim 2, wherein a part of the metal elements are dissolved, dispersed or suspended in the form of acetylacetonates and then hydrolyzed with an alkali to obtain a gelled hydrolyzate, the rest of the metal elements being added to the hydrolyzate in the form of inorganic salts, hydroxides or oxides or a mixture thereof, and the mixture is dried prior to the sintering.

5. The process according to claim 1, wherein the homogeneous mixture is a reaction product obtained by reacting a mixture comprising at least one alkoxide selected from the group consisting of alkoxides of Mg, Ca, Sr and Ba, at least one alkoxide selected from the group consisting of alkoxides of Sc, Y and lanthanoides and an alkoxide of Cu, with acetone and ethyl acetate or with acetylacetone, and the reaction product is hydrolyzed prior to the sintering.

6. The process according to claim 1, wherein the metal elements for constituting the oxide system are Bi, Sr, Ca and Cu, and they are dissolved, dispersed or suspended at least partly in the form of acetylacetonates with any remainder being in the from of alkoxides.

7. The process according to claim 1, wherein the metal elements for constituting the oxide system are Tl, Ca, Ba and Cu, and are dissolved, dispersed or suspended at least partly in the form of acetylacetonates with any remainder being in the form of alkoxides.

8. The process according to claim 6, which further comprises removing solvent prior to sintering.

9. The process according to claim 7, which further comprises removing solvent prior to sintering.

* * * * *